United States Patent
Lee et al.

(10) Patent No.: US 8,338,815 B2
(45) Date of Patent: Dec. 25, 2012

(54) MEMORY UNITS AND RELATED SEMICONDUCTOR DEVICES INCLUDING NANOWIRES

(75) Inventors: Moon-Sook Lee, Seoul (KR);
 Byeong-Ok Cho, Seoul (KR);
 Man-Hyoung Ryoo, Gyeonggi-do (KR);
 Takahiro Yasue, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/851,268

(22) Filed: Aug. 5, 2010

(65) Prior Publication Data
US 2010/0314600 A1 Dec. 16, 2010

Related U.S. Application Data

(63) Continuation of application No. 12/339,577, filed on Dec. 19, 2008, now Pat. No. 7,790,610.

(30) Foreign Application Priority Data

Dec. 20, 2007 (KR) ................ 2007-134109

(51) Int. Cl.
 *H01L 29/04* (2006.01)
 *H01L 47/00* (2006.01)
(52) U.S. Cl. .................... 257/3; 257/E47.001
(58) Field of Classification Search .............. 438/652, 438/104; 257/E21.575, E21.665, E21.645, 257/3, E47.001; 977/891, 813, 943, 842, 977/890
See application file for complete search history.

(56) References Cited

U.S. PATENT DOCUMENTS

| 7,638,382 | B2 | 12/2009 | Murooka et al. | 438/197 |
| 7,660,146 | B2 | 2/2010 | Buehlmann et al. | 365/145 |
| 2005/0093025 | A1 | 5/2005 | Chen et al. | 257/211 |
| 2005/0285275 | A1 | 12/2005 | Son et al. | 257/773 |
| 2006/0011972 | A1* | 1/2006 | Graham et al. | 257/324 |
| 2006/0034116 | A1* | 2/2006 | Lam et al. | 365/151 |

(Continued)

FOREIGN PATENT DOCUMENTS

KR 0709463 4/2007
KR 100718142 B1 5/2007

(Continued)

*Primary Examiner* — Caridad Everhart
(74) *Attorney, Agent, or Firm* — Myers Bigel Sibley & Sajovec

(57) ABSTRACT

Methods of fabricating a memory unit are provided including forming a plurality of first nanowire structures, each of which includes a first nanowire extending in a first direction parallel to the first substrate and a first electrode layer enclosing the first nanowire, on a first substrate. The first electrode layers are partially removed to form first electrodes beneath the first nanowires. A first insulation layer filling up spaces between structures, each of which includes the first nanowire and the first electrode, is formed on the first substrate. A second electrode layer is formed on the first nanowires and the first insulation layer. A plurality of second nanowires is formed on the second electrode layer, each of which extends in a second direction perpendicular to the first direction. The second electrode layer is partially etched using the second nanowires as an etching mask to form a plurality of second electrodes. Related memory units, methods of fabricating semiconductor devices and semiconductor devices are also provided.

6 Claims, 28 Drawing Sheets

U.S. PATENT DOCUMENTS

| | | | |
|---|---|---|---|
| 2007/0086235 A1* | 4/2007 | Kim et al. | 365/163 |
| 2007/0183189 A1* | 8/2007 | Nirschl et al. | 365/163 |
| 2007/0257246 A1* | 11/2007 | Bakkers et al. | 257/2 |
| 2008/0100345 A1* | 5/2008 | Bratkovski et al. | 326/104 |
| 2008/0193359 A1* | 8/2008 | Yu et al. | 423/344 |
| 2009/0085024 A1* | 4/2009 | Muralidhar et al. | 257/4 |
| 2009/0137091 A1 | 5/2009 | Lee | 438/301 |
| 2009/0294755 A1 | 12/2009 | Kuekes et al. | 257/9 |
| 2010/0025658 A1 | 2/2010 | Colli | 257/24 |
| 2010/0068828 A1* | 3/2010 | Thomas et al. | 438/3 |

FOREIGN PATENT DOCUMENTS

| | | |
|---|---|---|
| WO | WO 03/007304 A2 | 1/2003 |

\* cited by examiner

SECOND DIRECTION  THIRD DIRECTION  FIRST DIRECTION

THIRD DIRECTION
SECOND DIRECTION
FIRST DIRECTION

MEMORY UNITS AND RELATED SEMICONDUCTOR DEVICES INCLUDING NANOWIRES

CLAIM OF PRIORITY

This application is a continuation of U.S. patent application Ser. No. 12/339,577, filed Dec. 19, 2008 (now U.S. Pat. No. 7,790,610), which claims the benefit of Korean Patent Application No. 10-2007-134109, filed Dec. 20, 2007, the contents of which are hereby incorporated herein by reference.

FIELD

Example embodiments relate generally to semiconductor devices and, more particularly, semiconductor devices including nanowires.

BACKGROUND

Recently, research related to semiconductor devices using a bi-state material, such as phase-change random access memory (PRAM) devices, ferroelectric RAM (FRAM) devices, resistive RAM (RRAM) devices, and magnetic RAM (MRAM) devices has been carried out. Particularly, for the purpose of realizing a high integration degree, semiconductor devices having nanowire channels including a bi-state material have been developed.

Methods of forming nanowires may be divided into a top-down method and a bottom-up method. Each of these methods has its own advantages and disadvantages. For example, in the top-down method, forming a nanowire at a desired position can be relatively simple, however, forming a nanowire smaller than a certain size may not be as simple, so a high integration degree may not be realized. In order address such disadvantages, a double-patterning method has been developed, however, performing the method can be complicated. In the bottom-up method, forming nanowires at desired positions in a desired arrangement may be difficult, even though forming nanowires having minute sizes can be relatively simple. Additionally, when a diode and a memory unit is formed by growing nanowires on a substrate, a process for patterning catalyst and a high temperature heat treatment process are performed on the same substrate, which may be difficult.

SUMMARY OF EMBODIMENTS OF THE INVENTION

Some embodiments provide methods of fabricating a memory unit including forming a plurality of first nanowire structures, each of which includes a first nanowire extending in a first direction parallel to the first substrate and a first electrode layer enclosing the first nanowire, on a first substrate. The first electrode layers are partially removed to form first electrodes beneath the first nanowires. A first insulation layer filling up spaces between structures, each of which includes the first nanowire and the first electrode, is formed on the first substrate. A second electrode layer is formed on the first nanowires and the first insulation layer. A plurality of second nanowires is formed on the second electrode layer, each of which extends in a second direction perpendicular to the first direction. The second electrode layer is partially etched using the second nanowires as an etching mask to form a plurality of second electrodes.

In further embodiments, when the plurality of first nanowire structures are formed on the first substrate, a second insulation layer may be formed on the first substrate to form a first nanowire block including the first nanowire structures and the second insulation layer. Each of the first nanowire structures may have been grown in a third direction perpendicular to the first substrate, and the second insulation layer may enclose the first nanowire structures. The first nanowire block may be moved so that each of the first nanowire structures may extend in the first direction. The second insulation layer may be removed.

In still further embodiments, when the plurality of first nanowire structures are formed on the first substrate, a third insulation layer may be formed on a second substrate to form a second nanowire block including the first nanowire structures and the third insulation layer. Each of the first nanowire structures may have been grown in a fourth direction perpendicular to the second substrate, and the third insulation layer may enclose the first nanowire structures. The second nanowire block may be moved onto the first substrate so that each of the first nanowire structures may extend in the first direction. The third insulation layer may be removed.

In some embodiments, when the plurality of first nanowire structures are disposed on the first substrate, the first substrate may be moved above a third substrate so that the first nanowire structures may be attached onto a first face of the first substrate and each first nanowire structures may extend in the first direction. The first nanowire structures may have been grown on the third substrate.

In further embodiments, a fourth insulation layer having an opening defining a region in which the first nanowire structures may be disposed may be formed on the first face of the first substrate.

In still further embodiments, a material having a viscosity may be coated on the first substrate so that the first nanowire structures may be attached onto the first face of the first substrate.

In some embodiments, when the plurality of second nanowires is disposed on the second electrode layer, a fifth insulation layer may be formed on a fourth substrate to form a third nanowire block including the second nanowire structures and the fifth insulation layer. Each of the second nanowire structures may have been grown in a fifth direction perpendicular to the fourth substrate, and the fifth insulation layer may enclose the second nanowire structures. The third nanowire block may be moved onto the second electrode layer so that each of the second nanowire structures may extend in the second direction. The fifth insulation layer may be removed.

In further embodiments, the second nanowires may be removed. In certain embodiments, each of the first nanowires may have a regular polygonal cross-section.

In still further embodiments, the first nanowires may include a phase-change material, a ferroelectric material or a resistance-change material.

Some embodiments provide methods of fabricating memory units including forming a first electrode layer is formed on a first substrate. A plurality of first nanowires, each of which extends in a first direction parallel to the first substrate, on the first electrode layer. The first electrode layer is partially etched using the first nanowires as an etching mask to form a plurality of first electrodes beneath the first nanowires. A first insulation layer filling up spaces between structures, each of which includes the first nanowire and the first electrode, is formed on the first substrate. A second electrode layer is formed on the first nanowires and the first insulation layer. A plurality of second nanowires, each of which extends in a second direction perpendicular to the first direction, is disposed on the second electrode layer. The second electrode layer is partially etched using the second nanowires as an etching mask to form a plurality of second electrodes.

Further embodiments provide methods including forming a first conductive layer on a first substrate. A diode layer is formed on the first conductive layer. A plurality of nanowire structures, each of which includes a first nanowire extending in a first direction parallel to the first substrate and a first electrode layer enclosing the first nanowire, is formed on the diode layer. The first electrode layers, the diode layer and the first conductive layer are partially etched using the first nanowires as an etching mask to form a plurality of first electrodes, a plurality of diodes and a plurality of conductive lines under the first nanowires. A first insulation layer filling up spaces between structures, each of which includes the first nanowire, the first electrode, the diode and the first conductive line, is formed on the first substrate. A second conductive layer is formed on the first nanowires and the first insulation layer. A plurality of second nanowires, each of which extends in a second direction perpendicular to the first direction, is disposed on the second conductive layer. viii) The second conductive layer is partially removed using the second nanowires as an etching mask to form a plurality of second conductive lines.

In still further embodiments, prior to forming the second conductive layer on the first nanowires and the first insulation layer, a second electrode layer may be further formed on the first nanowires and the first insulation layer. When the second conductive lines are formed, the second conductive layer and the second electrode layer may be partially removed using the second nanowires as an etching mask to form the plurality of second conductive lines and a plurality of second electrodes.

In some embodiments, the first conductive lines may serve as word lines and the second conductive lines may serve as bit lines.

In further embodiments, when the first nanowires are disposed on the first substrate, a second insulation may be formed on the first substrate to form a first nanowire block including the first nanowire structures and the second insulation layer. Each of the first nanowire structures may have been grown in a third direction perpendicular to the first substrate, and the second insulation layer may enclose the first nanowire structures. The first nanowire block may be moved so that each of the first nanowire structures may extend in the first direction. The second insulation layer may be removed.

In still further embodiments, when the plurality of first nanowire structures is disposed on the first substrate, the first substrate may be moved above a second substrate so that the first nanowire structures having been grown on the second substrate may be attached onto a first face of the first substrate and each first nanowire structures may extend in the first direction.

In some embodiments, the second nanowires may be removed.

In further embodiments, a third insulation layer may be formed on the first nanowires, the first insulation layer and the second conductive lines to fill up spaces between the second conductive lines. In these embodiments, all of the may be repeatedly performed.

Still further embodiments provide method of fabricating semiconductor devices including forming a plurality of gate structures, each of which extends in a first direction, on a substrate. First impurity regions and second impurity regions are formed at portions of the substrate adjacent to the gate structures. First conductive lines electrically connected to the first impurity regions are formed. Each of the first conductive lines extends in the first direction. Pads electrically connected to the second impurity regions are formed. Each of the pads extends in the first direction. A plurality of first nanowire structures contacting top portions of the pads is disposed. Each of the first nanowire structures includes a first nanowire extending in a second direction perpendicular to the first direction and a first electrode layer enclosing the first nanowire. The first electrode layers are partially removed using the first nanowires as an etching mask to form a plurality of first electrodes beneath the first nanowires. An insulation layer filling up spaces between structures, each of which includes the first nanowire and the first electrode, is formed. A second electrode layer and a conductive layer are formed on the first nanowires and the insulation layer. A plurality of second nanowires overlapping the first nanowires is formed on the conductive layer. The conductive layer and the second electrode layer are partially removed using the second nanowires as an etching mask to form a plurality of second conductive lines and a plurality of second electrode layers.

Some embodiments provide a memory unit including a plurality of first electrodes, a plurality of first nanowires, and a plurality of second electrodes. Each of the first electrodes extends in a first direction parallel to the substrate. The first nanowires are formed on the first electrodes, respectively. The second electrodes, each of which extends in a second direction perpendicular to the first direction, contact top portions of the first nanowires.

In further embodiments, each of the first electrodes and each of the first nanowires may have substantially the same width in the second direction.

Still further embodiments provide a semiconductor device including a plurality of first conductive lines, a plurality of diodes, a plurality of first electrodes, a plurality of nanowires, and a plurality of second conductive lines. Each of the first conductive lines extends in a first direction parallel to the substrate. The diodes are formed on the first conductive lines, respectively. The first electrodes are formed on the diodes, respectively. The nanowires are formed on the first electrode, respectively. The second conductive lines, each of which extends in a second direction perpendicular to the first direction, contact top portions of the nanowires.

In some embodiments, the semiconductor device may further include a plurality of second electrodes contacting top portions of the nanowires beneath the second conductive lines.

Further embodiments provide a stacked semiconductor device may include a plurality of the above semiconductor devices and an insulation layer. The semiconductor devices may be stacked in a third direction perpendicular to the substrate, and the insulation layer may be formed between the semiconductor devices.

In still further embodiments, after nanowires are grown by a bottom-up method, the nanowires are moved so that the nanowires may be disposed parallel to the substrate. Electrode patterns may be formed using the nanowires as an etching mask, thereby manufacturing a cross-point array type memory unit. A diode layer and a conductive layer may be partially etched using the nanowires as an etching mask, so that a lower electrode and a word line may be formed. Similarly, an upper electrode and a bit line may be formed using the nanowires as an etching mask, so that a cross-point array type semiconductor device may be easily manufactured. A stacked semiconductor device including a plurality of semiconductor devices may be easily manufactured by stacking the above semiconductor devices.

BRIEF DESCRIPTION OF THE DRAWINGS

Example embodiments will be more clearly understood from the following detailed description taken in conjunction with the accompanying drawings.

FIGS. 1 to 12 are perspective views illustrating processing steps in the fabrication of memory units in accordance with some embodiments.

FIGS. 13 to 20 are perspective views illustrating processing steps in the fabrication of memory units in accordance with some embodiments.

FIGS. 21 to 24 are perspective views illustrating processing steps in the fabrication of memory units in accordance with some embodiments.

FIGS. 25 to 30 are perspective views illustrating processing steps in the fabrication of memory units in accordance with some embodiments.

FIGS. 31 to 37 are perspective views illustrating processing steps in the fabrication of semiconductor devices in accordance with some embodiments.

FIG. 38 is a perspective view illustrating processing steps in the fabrication of semiconductor devices in accordance with some embodiments.

FIGS. 39 to 51 are cross-sectional views illustrating processing steps in the fabrication of semiconductor devices in accordance with some embodiments.

DETAILED DESCRIPTION OF THE EMBODIMENTS

Figure 1:
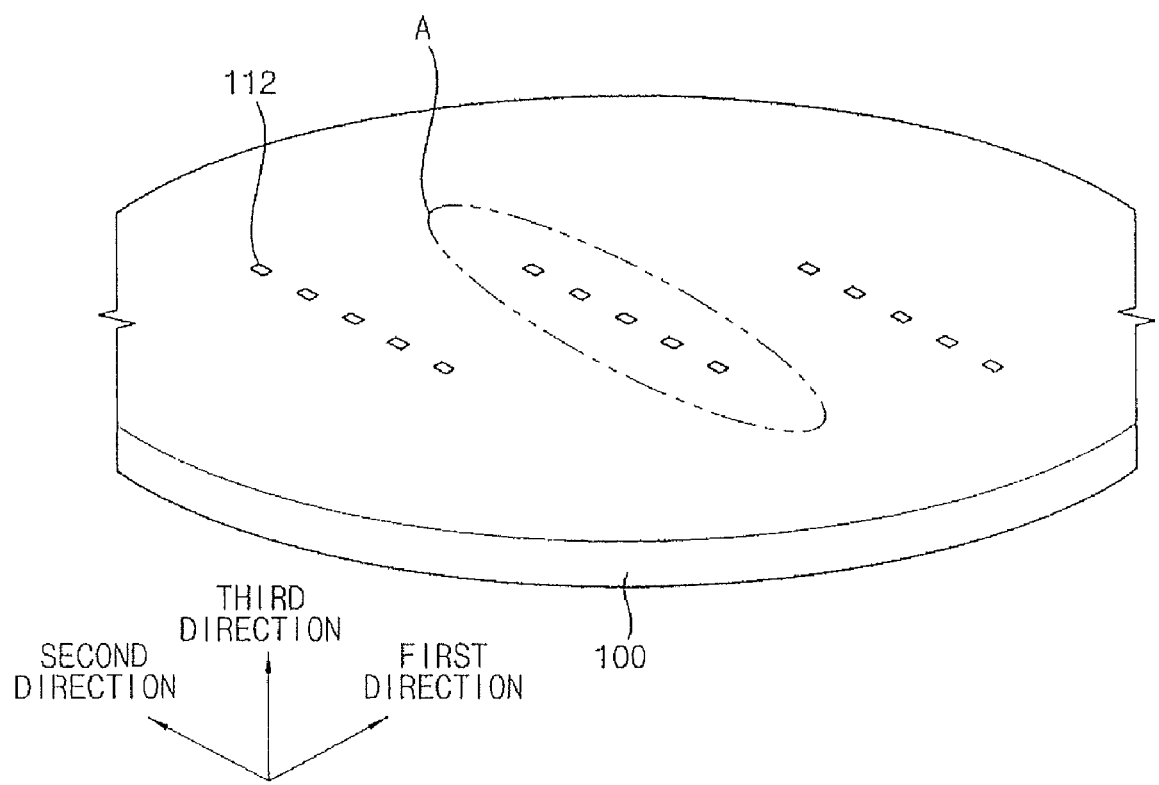
FIGS. 1 through 51 represent non-limiting, example embodiments as described herein.

Various example embodiments will be described more fully hereinafter with reference to the accompanying drawings, in which some embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 12 are perspective views illustrating processing steps in the fabrication of memory units in accordance with some embodiments. Referring first to FIG. 1, a plurality of first catalyst particles 112 is applied onto a first substrate 100. The first substrate 100 may include a semiconductor material such as silicon, germanium, ant the like. In some embodiments, the first substrate 100 may include an insulating material such as silicon oxide, silicon nitride, and the like.

Each of the first catalyst particles 112 has a diameter of about several nanometers, and may include a metal. For example, the first catalyst particles 112 may include gold, nickel, cobalt, aluminum, and the like. The first catalyst particles 112 may be applied onto the first substrate 100 by an imprint method, a lift-off method or a photo-etch method without departing from the scope of the present invention.

The first catalyst particles 112 are applied onto the first substrate 100 at a certain distance therebetween in a second direction parallel to the first substrate 100, and may form a first catalyst particle column. In some embodiments, a plurality of the first catalyst particle columns is formed at a certain distance therebetween in a first direction perpendicular to the second direction, and may form a first catalyst particle array. Hereinafter, only one first catalyst particle column (shown in area A) will be described for the convenience of explanation.

Figure 2:
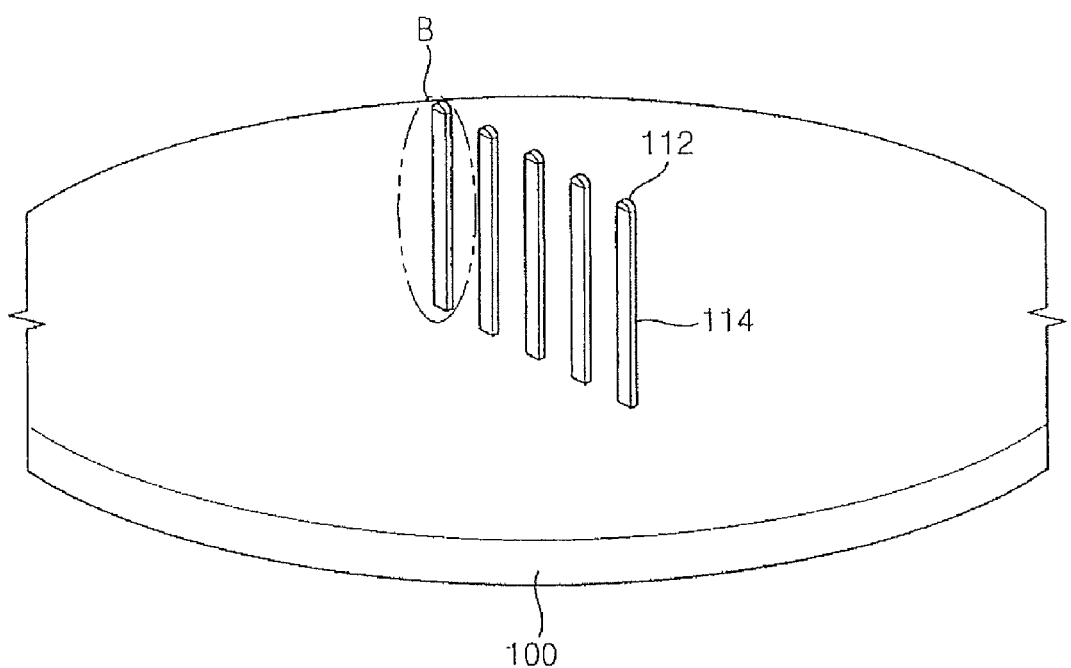

Referring now to FIG. 2, a chemical vapor deposition (CVD) process using a nanowire source gas is performed to grow a plurality of first nanowires 114 at positions where the first catalyst particles 112 are formed. The first catalyst particles 112 may remain on the first nanowires 114. The first nanowires 114 may grow to a certain length in a third direction perpendicular to the first substrate 100. As the first nanowires 114 grow, a first nanowire column and a first nanowire array, which correspond to the first catalyst particle column and the first catalyst particle array, respectively, may be formed on the first substrate 100.

In some embodiments, the first nanowires 114 may be formed using a phase-change material. In particular, the first nanowires 114 may be formed using a chalcogenide, such as germanium-antimony-tellurium (GST) or GST doped with carbon, nitrogen and/or a metal.

In some embodiments, the first nanowires 114 may be formed using a ferroelectric material. In particular, the first nanowires 114 may be formed using PZT[Pb(Zr, Ti)O$_3$], SBT [SrBi$_2$TiO$_9$], BLT[Bi(La, Ti)O$_3$], PLZT[Pb(La, Zr)TiO$_3$] or BST[Bi(Sr, Ti)O$_3$]. In some embodiments, the first nanowires 114 may be formed using PZT, SBT, BLT, PLZT or BST doped with impurities such as calcium (Ca), lanthanum (La), manganese (Mn), bismuth (Bi), and the like. In still further embodiments, the first nanowires 114 may be formed using a metal oxide, such as titanium oxide (TiO$_2$), tantalum oxide (TaO$_2$), aluminum oxide (Al$_2$O$_3$), zinc oxide (ZnO$_2$), hafnium oxide (HfO$_2$).

In some embodiments, the first nanowires 114 may be formed using a resistance-change material. In particular, the first nanowires 114 may be formed using a two-component metal oxide. For example, the first nanowires 114 may be formed using vanadium oxide, nickel oxide, niobium oxide, titanium oxide, zirconium oxide, hafnium oxide, cobalt oxide, iron oxide, copper oxide, aluminum oxide, chromium oxide, and the like.

In further embodiments, the first nanowires 114 may be formed using a magnetic material. In particular, the first nanowires 114 may be formed using a metal silicon compound, such as cobalt silicon, or a metal compound such as NiFe, NiFeCo, IrMn, and the like.

Figure 3:
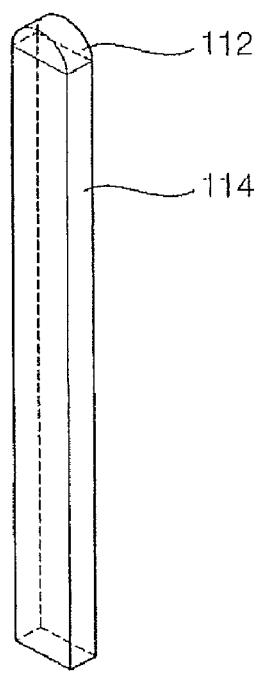

FIG. 3 is an enlarged perspective view of area B in FIG. 2. As illustrated in FIG. 3, each of the first nanowires 114 may grow in the third direction to have a rectangular cross-sectional area. In some embodiments, each of the first nanowires 114 may grow in the third direction to have a polygonal cross-sectional area or a circular cross-sectional area.

Figure 4:
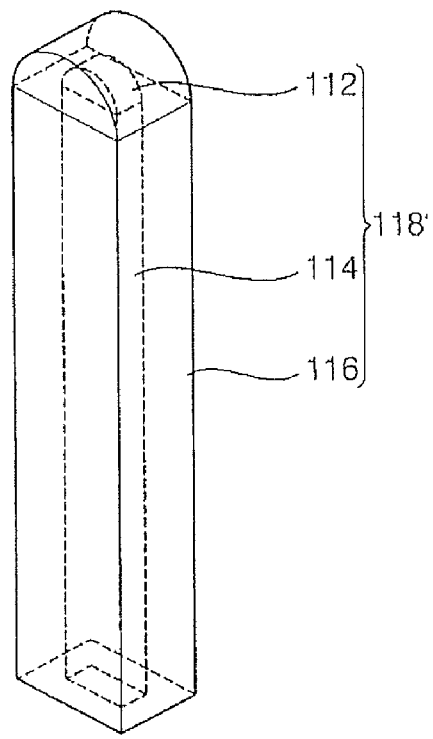

FIG. 4 is an enlarged perspective view illustrating a resultant structure of the first nanowire 114 and the first catalyst particle 112 after a successive process. As illustrated in FIG. 4, a first electrode layer 116 is formed to enclose the first nanowire 114 and the first catalyst particle 112. Thus, a first nanowire structure 118 including the first nanowire 114, the first catalyst particle 112 and the first electrode layer 116 may be formed. The first electrode layer 116 may be formed by a CVD process or an atomic layer deposition (ALD) process.

The first electrode layer 116 may be formed using a metal or a metal compound. For example, the first electrode layer 116 may be formed using tungsten, aluminum, copper, tantalum, titanium, molybdenum, niobium, zirconium, aluminum nitride, titanium aluminum nitride, titanium nitride, tungsten nitride, tantalum nitride, molybdenum nitride, molybdenum titanium nitride, molybdenum aluminum nitride, niobium nitride, titanium boron nitride, tungsten boron nitride, zirconium aluminum nitride, tantalum aluminum nitride, zirconium silicon nitride, tantalum silicon nitride, molybdenum silicon nitride, tungsten silicon nitride, titanium silicon nitride, and the like. These may be used alone or in a mixture thereof.

Figure 5:
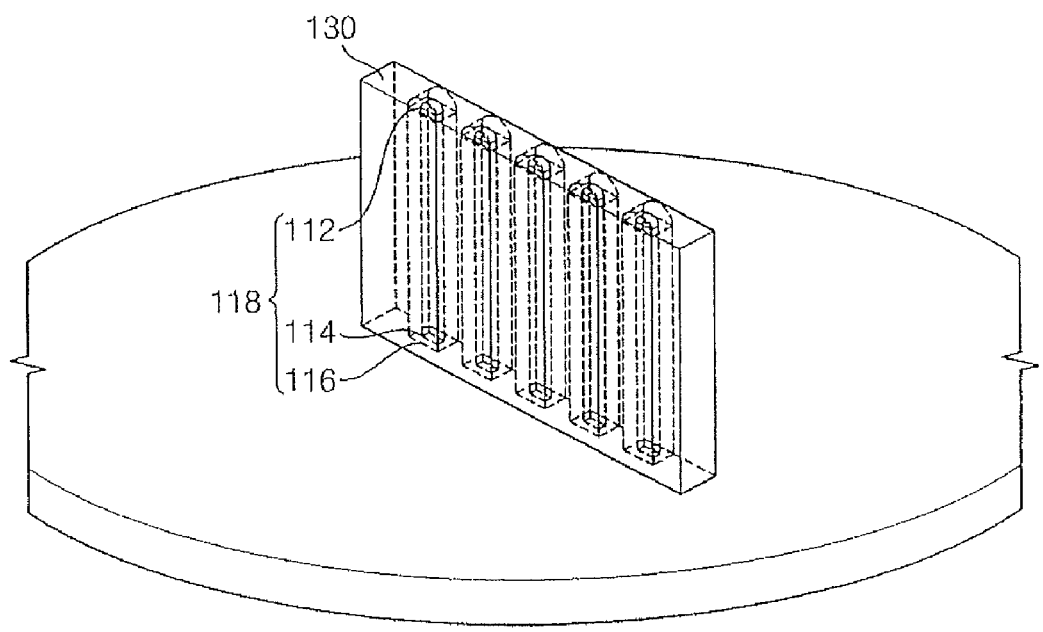

FIG. 5 is a perspective view illustrating a resultant structure of a first nanowire structure column including the first nanowire structures 118 in area A after a successive process. As illustrated in FIG. 5, a first insulation layer 130 is formed on the first substrate 100 to cover the first nanowire structures 118. Thus, a first nanowire block including the first nanowire structures 118 and the first insulation layer 130 may be formed. The first insulation layer 130 may be formed using an insulation layer such as silicon oxide, silicon nitride, and the like.

In some embodiments, the first insulation layer 130 is formed to cover the first nanowire structure column including the plurality of the first nanowire structures 118 disposed in the second direction. In further embodiments, the first insulation layer 130 may be formed to cover the first nanowire structure array including the plurality of the first nanowire structure columns disposed in the first direction. When the first insulation layer is formed to cover the first nanowire structure array, the first insulation layer 130 may be partially removed so that a plurality of insulation layer patterns (not shown) may be formed at a distance from each other. Thus, a plurality of first nanowire blocks each of which includes one insulation layer pattern and one first nanowire structure column may be formed.

Meanwhile, a directional dry etching process may be performed on the first insulation layer 130 so that one surface of each first nanowire structure 118 may be exposed.

Figure 6:
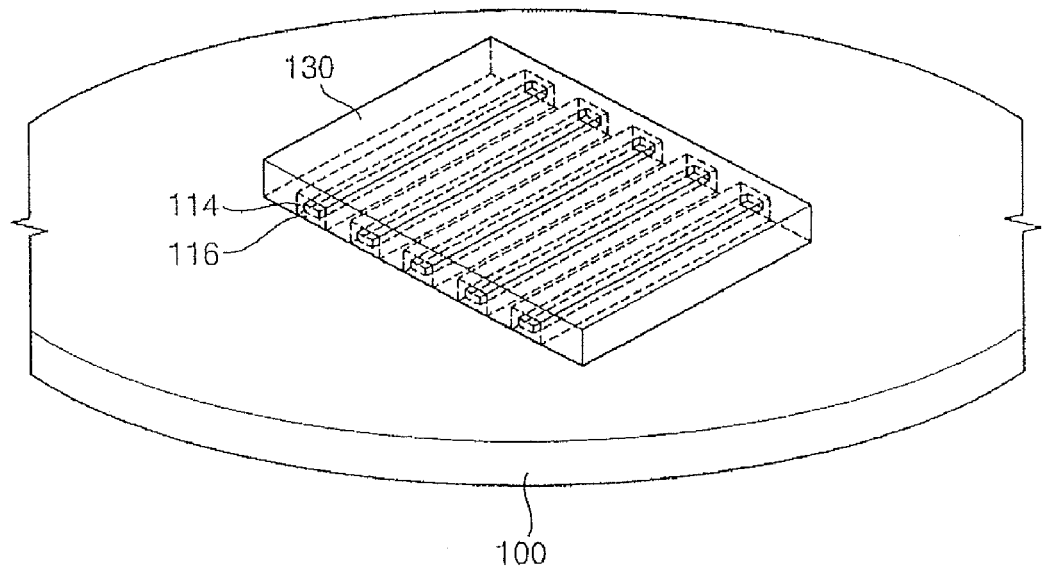

Referring now to FIG. 6, each of the first nanowire blocks is moved so that the first nanowire structures 118 are arrange in a direction parallel to the first substrate 100. In some embodiments, each first nanowire block is rotated 90 degrees so that each of the first nanowire structures 118 may be arranged in the first direction. The exposed surfaces of the first nanowire structures 118 may contact the first substrate 100. Hereinafter, the case in which each of the first nanowire structures 118 is arranged in the first direction will be described.

In some embodiments, the first nanowire blocks may not be moved onto the first substrate 100 but onto another substrate (not shown). In particular, the first nanowire blocks may be moved onto another substrate, so that each of the first nanowire structures 118 may be arranged in a direction parallel to the substrate. In this case, the first nanowire blocks are moved onto the substrate on which the first nanowires 114 are not originally grown. Thus, after growing the first nanowires 114 on one substrate where the first nanowires 114 may be easily grown, a process for manufacturing a semiconductor device may be performed on another substrate where the semiconductor device may be easily manufactured.

Meanwhile, both end portions of each first nanowire block may be removed. Particularly, both end portions of each first nanowire block in the first direction may be removed, so that the first catalyst particles 112 of the first nanowire structures 118 may be removed. In particular, the first catalyst particles 112 lowering the uniformity of the electrical characteristics of the first nanowires 114 are removed, and lengths of the first nanowires 114 having been overgrown are controlled.

Figure 7:
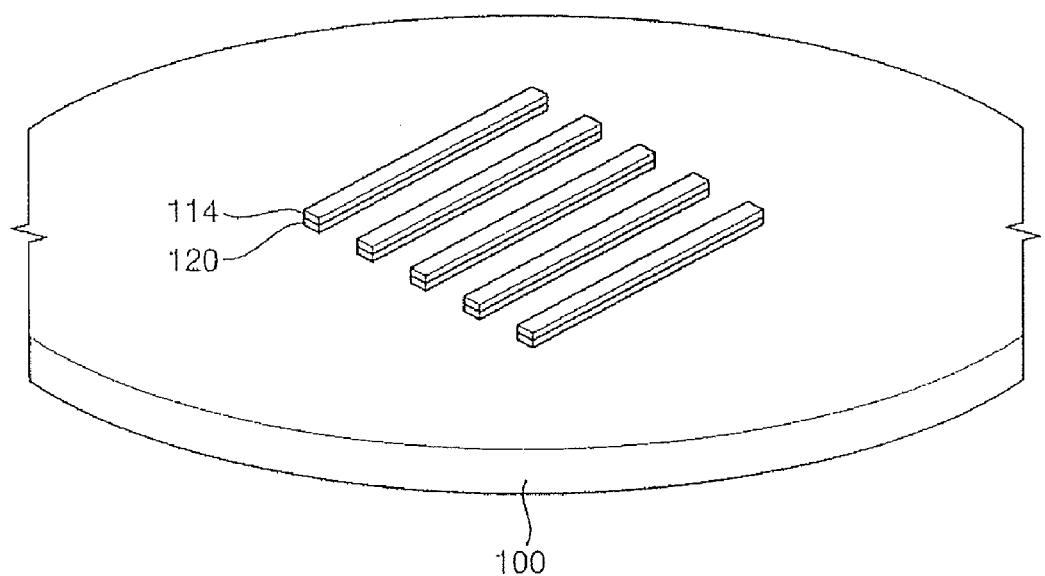

Referring to FIG. 7, the first insulation layer 130 is removed. In some embodiments, the first insulation layer 130 is removed by a dry etching process. In further embodiments, the first insulation layer 130 may be removed by a wet etching process.

The first electrode layer 116 is partially removed. In some embodiments, a dry etching process is performed to remove portions of the first electrode layer 116 on an upper portion and a lateral portion of each first nanowire 114. Thus, a first electrode 120 beneath each first nanowire wire 114 may be formed. In the etching process, the first nanowires 114 may serve as an etching mask. In further embodiments, the lateral portion of each first nanowire 114 may be removed. In this case, a process for forming a second electrode 155 (see FIG. 12) may be omitted, and a portion of the first electrode layer 116 on the upper portion of each first nanowire 114 may serve as the second electrode 155.

Figure 8:
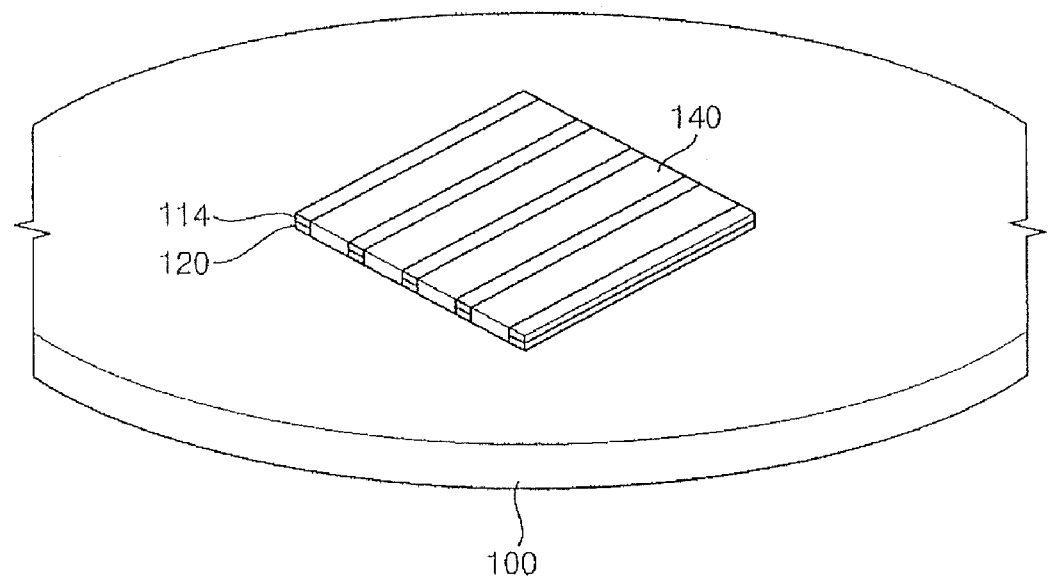

Referring now to FIG. 8, a second insulation layer 140 is formed at spaces between structures each of which includes the first electrode 120 and the first nanowire 114. Particularly, the second insulation layer 140 may be formed by depositing an insulating material on the first substrate 100 to fill the spaces between the above structures and planarizing an upper portion of the insulating material until top faces of the first nanowires 114 are exposed.

Figure 9:
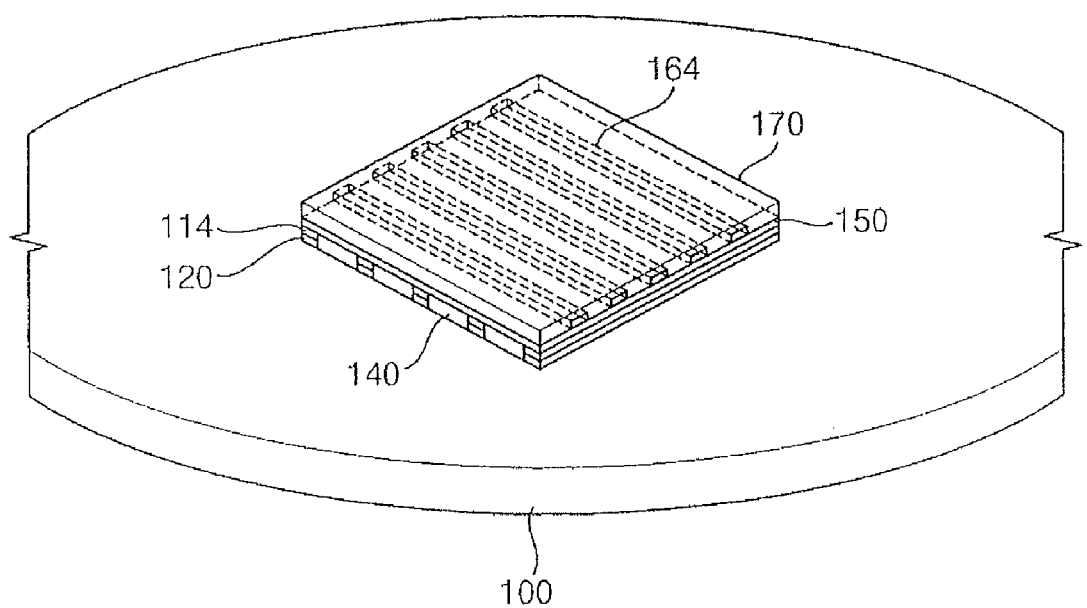

Referring now to FIG. 9, a second electrode layer 150 is formed on the first nanowires 114 and the second insulation layer 140, and a second nanowire block including a plurality of second nanowires 164 and a third insulation layer 170 is mounted on the second electrode layer 150. The second and third insulation layers 140 and 170 may be formed using an insulating material such as silicon oxide, silicon nitride, and the like. The second electrode layer 150 may be formed using a metal or a metal compound.

In some embodiments, the second nanowire block is mounted on the second electrode layer 150 so that each of the second nanowires 164 may extend in the second direction. Particularly, the second nanowires 164 may be grown on another substrate (not shown) by substantially the same method as that of the first nanowires 114, and the third insulation layer 170 is enclosing the second nanowires 164 is formed on the substrate, thereby forming the second nanowire block. The third insulation layer 170 may be formed so that one surface of each second nanowire 164 may be exposed. The second nanowire block may be moved onto the second electrode layer 150 so that each second nanowire 164 may extend in the second direction. An electrode layer (not shown) may be further formed on the second nanowires 164.

Figure 10:
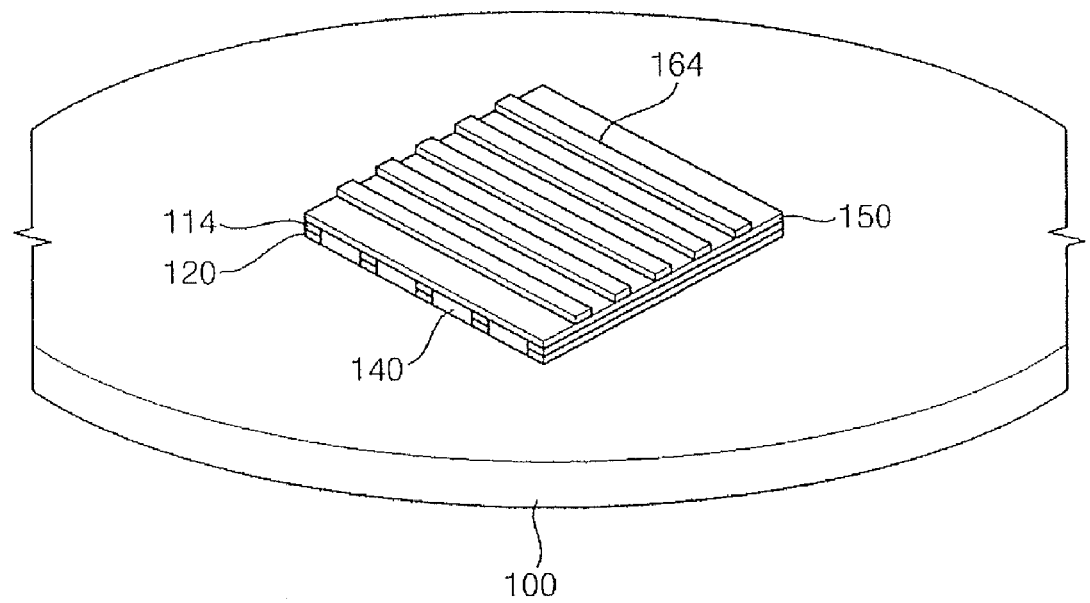

Referring now to FIG. 10, the third insulation layer 170 is removed. In some embodiments, the third insulation layer 170 may be removed a dry etching process. In further embodiments, the third insulation layer 170 may be removed by a wet etching process.

Figure 11:
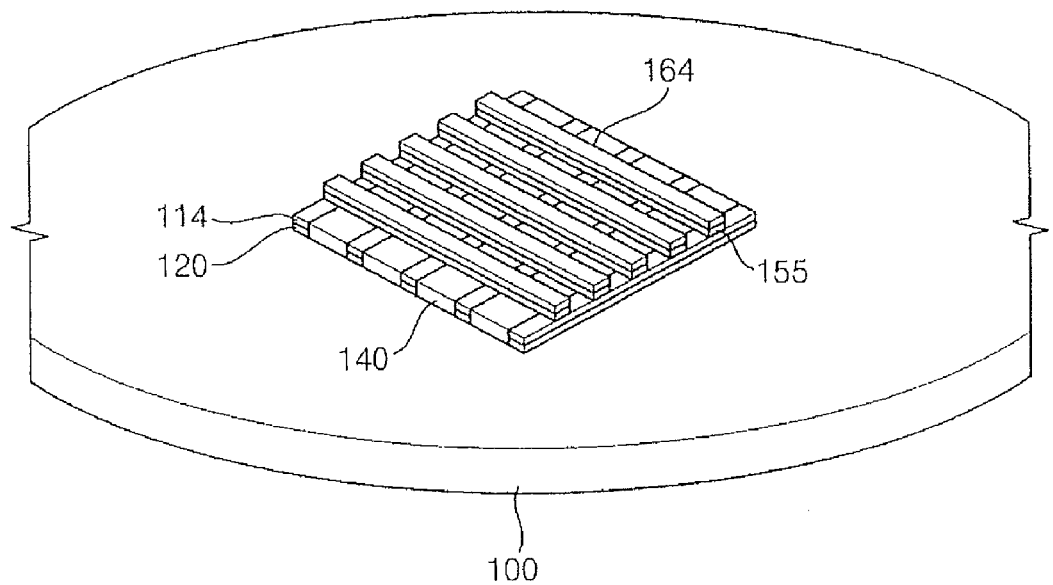

Referring now to FIG. 11, the second electrode layer 150 may be partially removed. In some embodiments, a dry etching process using the second nanowires 164 as an etching mask is performed on the second electrode layer 150 so that a plurality of second electrodes 155 each of which extends in the second direction may be formed.

Figure 12:
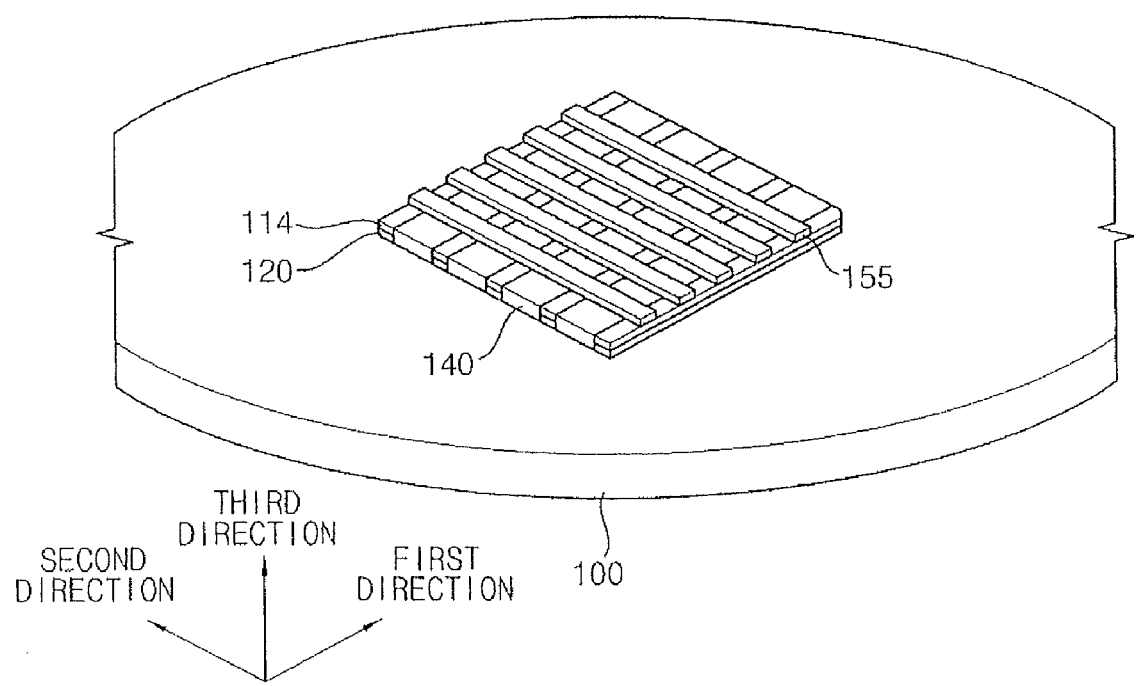

Referring now to FIG. 12, the second nanowires 164 on the second electrode 155 are removed so that the memory unit may be completed. The memory unit in accordance with some embodiments may have following structural characteristics. Each first electrode 120 and each first nanowire 114 extend in the first direction parallel to the first substrate 100, and each second electrode 155 extends in the second direction parallel to the first substrate 100 and simultaneously perpendicular to the first direction. Thus, each first electrode 120 and each first nanowire 114 are linearly disposed on the first substrate 100, and each second electrode 155 is linearly disposed to make contact with top portions of the first nanowires 114. Accordingly, the memory unit may be a cross-point array type memory unit.

If only the portions of the first electrode layers 116 on the lateral portions of the first nanowires 114 are removed during the process for forming the first electrodes 120, the portions of the first electrode layers 116 on the top portions of the first nanowires 116 may serve as the second electrodes 155, and thus the memory unit may have second electrodes each of which extends in the first direction. In this case, by forming bit lines each of which extends in the second direction and makes contact with top portions of the second electrodes, electrical signals may be applied only to some memory cells.

FIGS. 13 to 20 are perspective views illustrating processing steps in the fabrication memory units in accordance with some embodiments. In order to avoid repetitive explanations, processes similar to or substantially the same as those discussed above with respect to FIGS. 1 through 12 will not be explained again herein in detail, however, those skilled in the art can easily understand that the omitted processes are also within the scope of the present invention.

Figure 13:
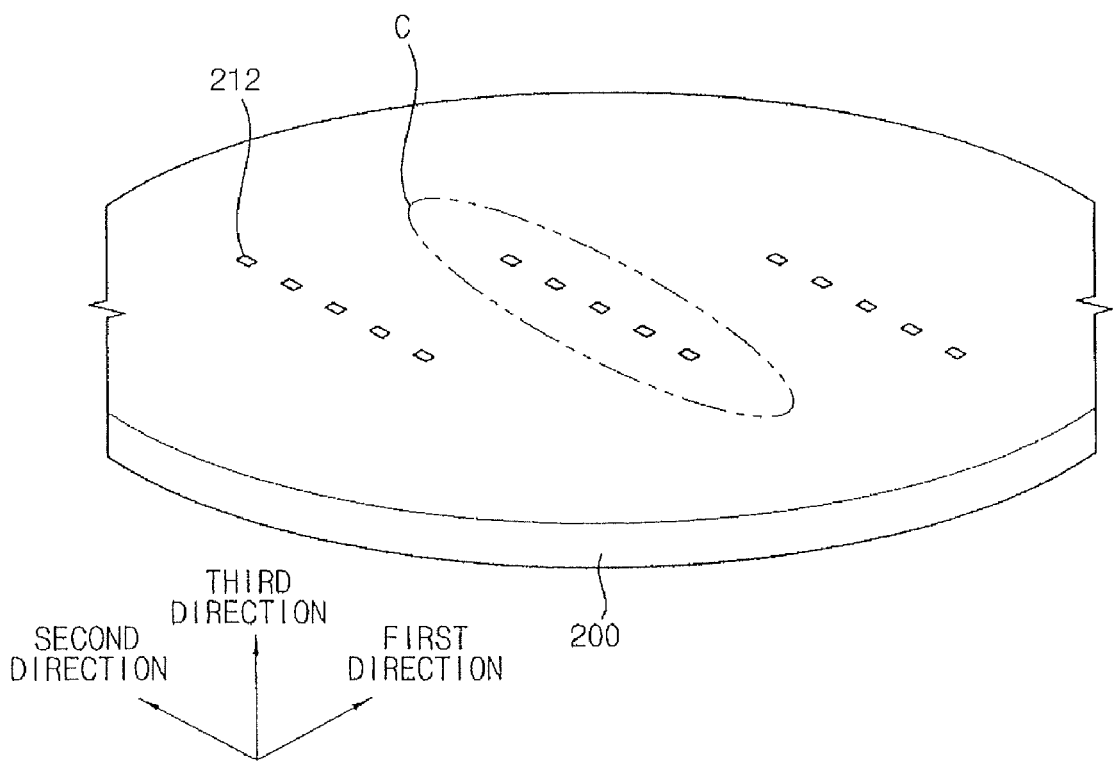

Referring first to FIG. 13, a plurality of second catalyst particles 212 is applied onto a second substrate 200. The second substrate 200 may include a semiconductor material such as silicon, germanium, or an insulating material such as silicon oxide, silicon nitride and the like.

The second catalyst particles 212 may be applied onto the second substrate 200 at a distance from each other in a second direction parallel to the second substrate 200, and thus may form a second catalyst particle column. In some embodiments, a plurality of the second catalyst particle columns is formed on the second substrate 200 at a distance from each other in a first direction perpendicular to the second direction, and forms a second catalyst particle array. In order to avoid the complication of the drawings, only one second catalyst particle column (see an area C) will be shown hereinafter.

Figure 14:
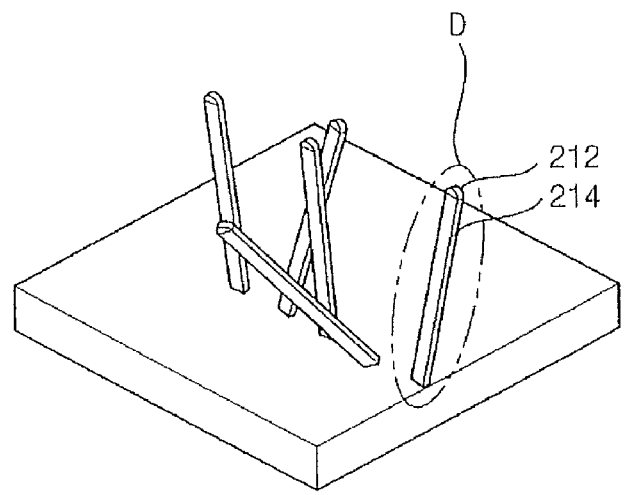

Referring now to FIG. 14, a CVD process using a nanowire source gas is performed to grow a plurality of second nanowires 214 at positions where the second catalyst particles 212 are formed. The second catalyst particles 212 may remain on the second nanowires 214. The second nanowires 214 may grow not only in a third direction substantially perpendicular to the second substrate 200, but also in a random direction not perpendicular to the second substrate 200. As the second nanowires 214 grow, a second nanowire column and a second nanowire array, which correspond to the second catalyst particle column and the second catalyst particle array, respectively, may be formed on the second substrate 200.

Figure 15:
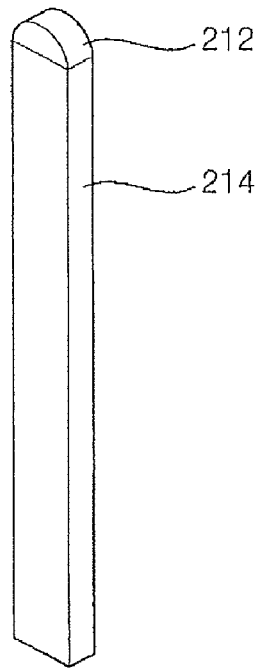

FIG. 15 is an enlarged perspective view of an area D in FIG. 14. As illustrated in FIG. 15, each of the second nanowires 214 may grow in the third direction to have a rectangular cross-sectional area. In further embodiments, each of the second nanowires 214 may grow in the third direction to have a polygonal cross-sectional area or a circular cross-sectional area.

Figure 16:
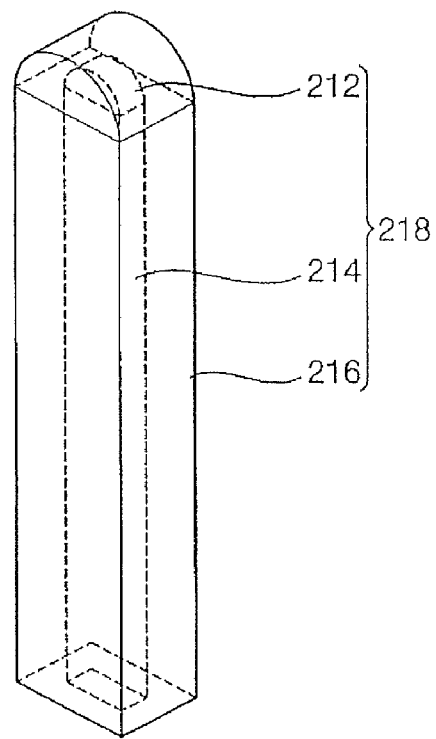

FIG. 16 is an enlarged perspective view illustrating a resultant structure of the second nanowire 214 and the second catalyst particle 212 after a successive process. As illustrated in FIG. 16, a third electrode layer 216 is formed to enclose the second nanowire 214 and the second catalyst particle 212. Thus, a second nanowire structure 218 including the second nanowire 214, the second catalyst particle 212 and the third electrode layer 216 may be formed.

Figure 17:
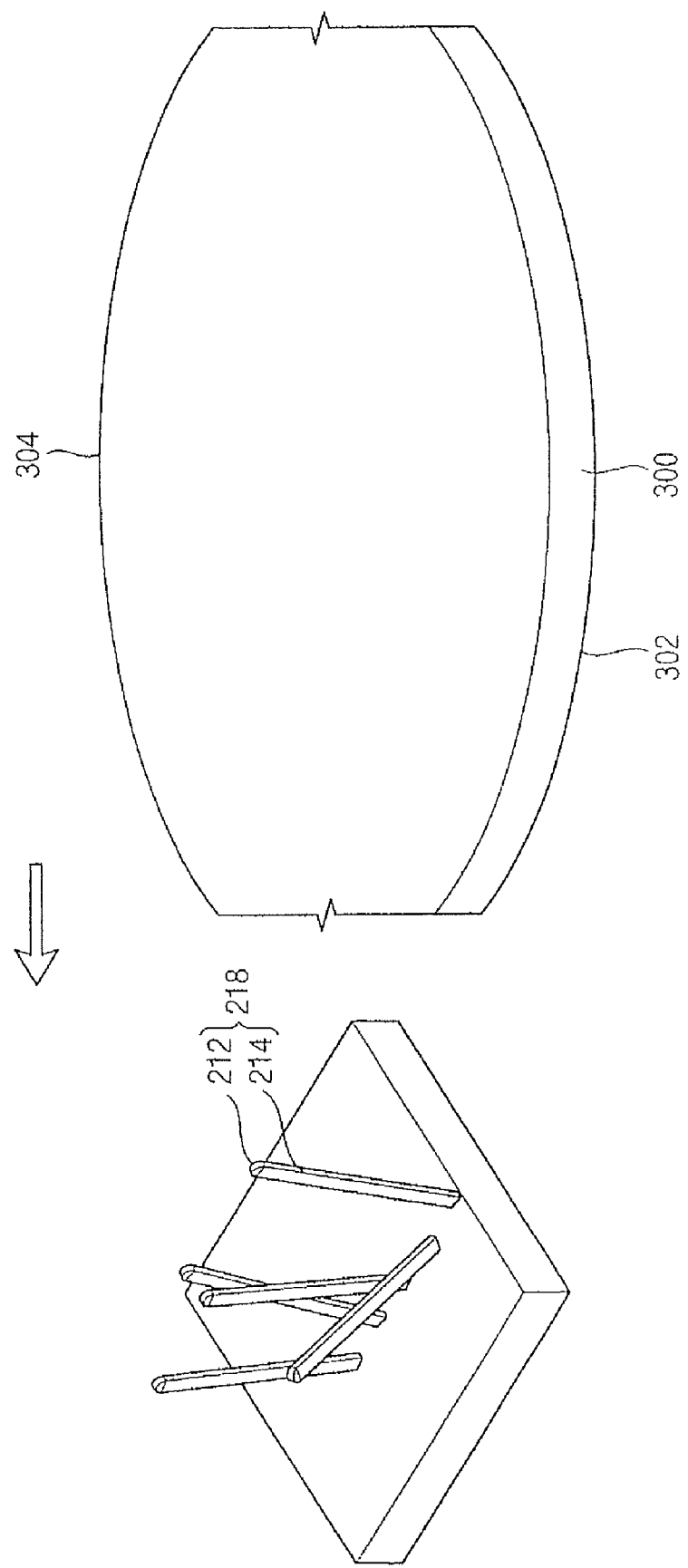
Figure 18:
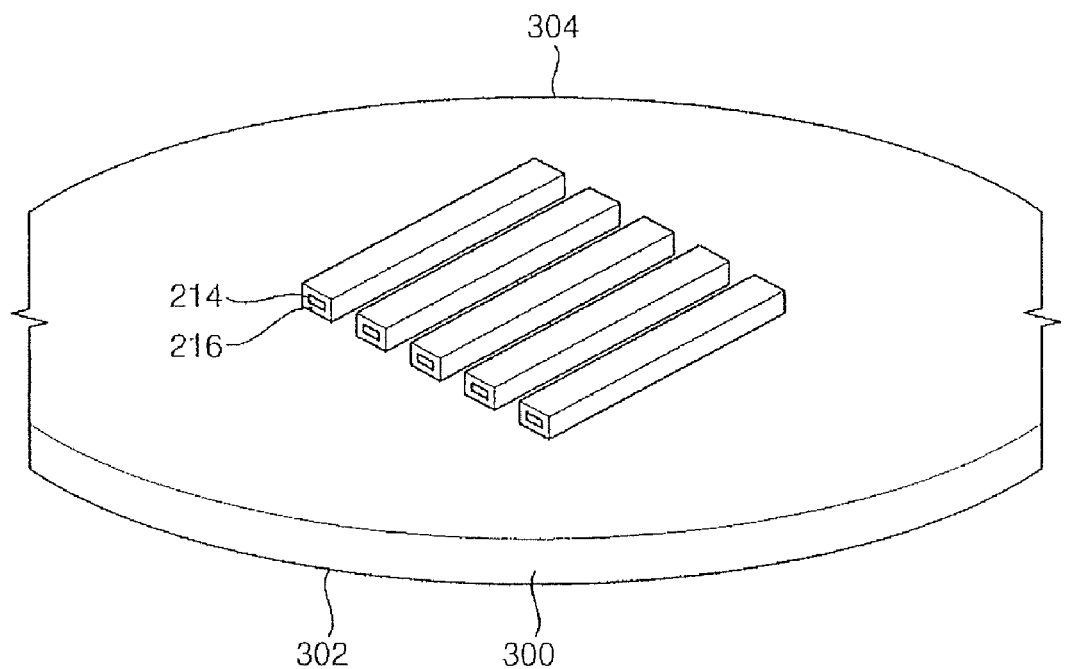

FIG. 17 is a perspective view illustrating a successive process performed on the resultant structure in the area C in which the second nanowire structures 218 is formed. In order to avoid the complication of the drawing, the third electrode layer 216 is not shown in FIG. 17. As illustrated in FIG. 17, a third substrate 300 is moved above the second substrate 200. The third substrate 300 may include a semiconductor material or an insulating material. The third substrate 300 has a first face 302 and a second face 304, and the third substrate 300 is moved above the second substrate 200, with the first face 302 facing the second substrate 200. FIG. 18 illustrates the third substrate 300 overturned. Hereinafter, the method of manufacturing the memory unit is illustrated with reference to FIG. 17 together with FIG. 18.

In some embodiments, the third substrate 300 is moved along the first direction (or along a direction opposite to the first direction), and thus the second nanowire structures 218 formed on the second substrate 200 may be attached to the first face 302 of the third substrate 300. Each of the second nanowire structures 218 may be disposed on the first face 302 of the third substrate 300 in the first direction. Thus, a second nanowire structure column including a plurality of second nanowire structures 218 each of which is arranged in the first direction on the first face 302 of the third substrate 300 may be formed. Additionally, a second nanowire structure array including a plurality of second nanowire structure columns at a distance from each other may be formed. An insulating material having a viscosity may be coated on the first face 302 so that the second nanowire structures 218 may be better attached to the first face 302 of the third substrate 300. For example, the insulating material may include industrial oil.

As shown in FIG. 18, the third substrate 300 is turned over so that the first face 302 may face upward, in order to easily form a second nanowire block on the third substrate 300.

In the process for attaching the second nanowire structures 218 to the first face 302 of the third substrate 300, the second catalyst particles 212 may be removed, and thus the second nanowire structures 218 from which the second catalyst particles 212 have been removed are shown in FIG. 18. In some embodiments, an insulation layer (not shown) is formed on the third substrate 300 to cover the second nanowire structures 218, and some portions of the insulation layer corresponding to the second catalyst particles 212 are removed together with the second catalyst particles 212. The remaining portion of the insulation layer may be removed.

Figure 19:
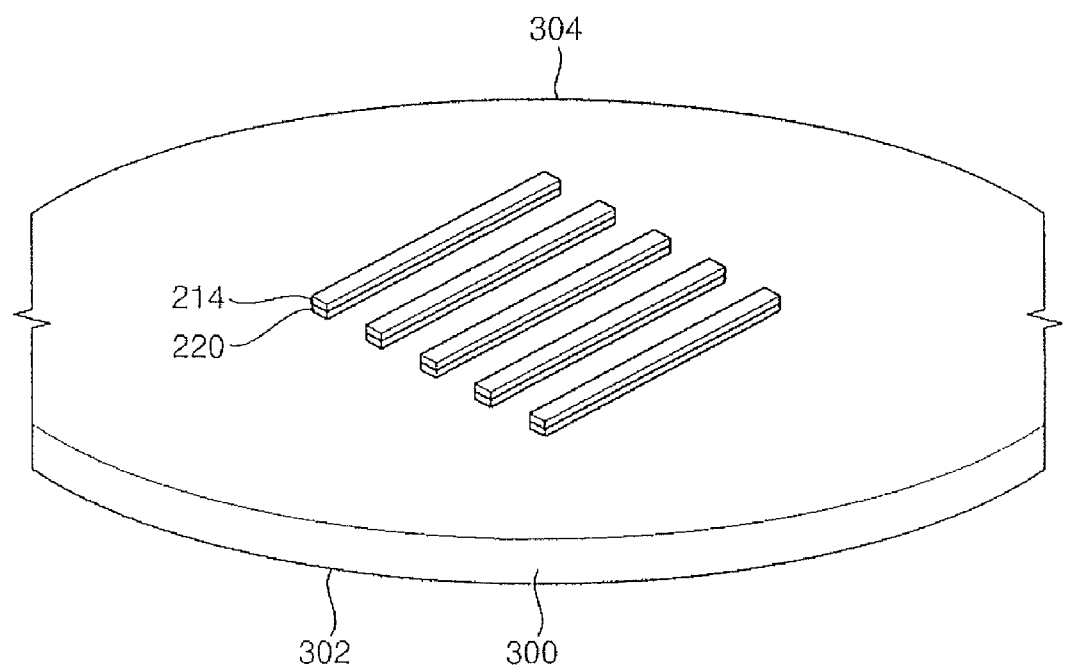

Referring now to FIG. 19, the third electrode layer 216 may be partially removed. In some embodiments, a dry etching process is performed to remove portions of the third electrode layer 216 on an upper portion and a lateral portion of each second nanowire 214. Thus, a third electrode 220 beneath each second nanowire 214 may be formed. In the etching process, the second nanowires 214 may serve as an etching mask.

Figure 20:
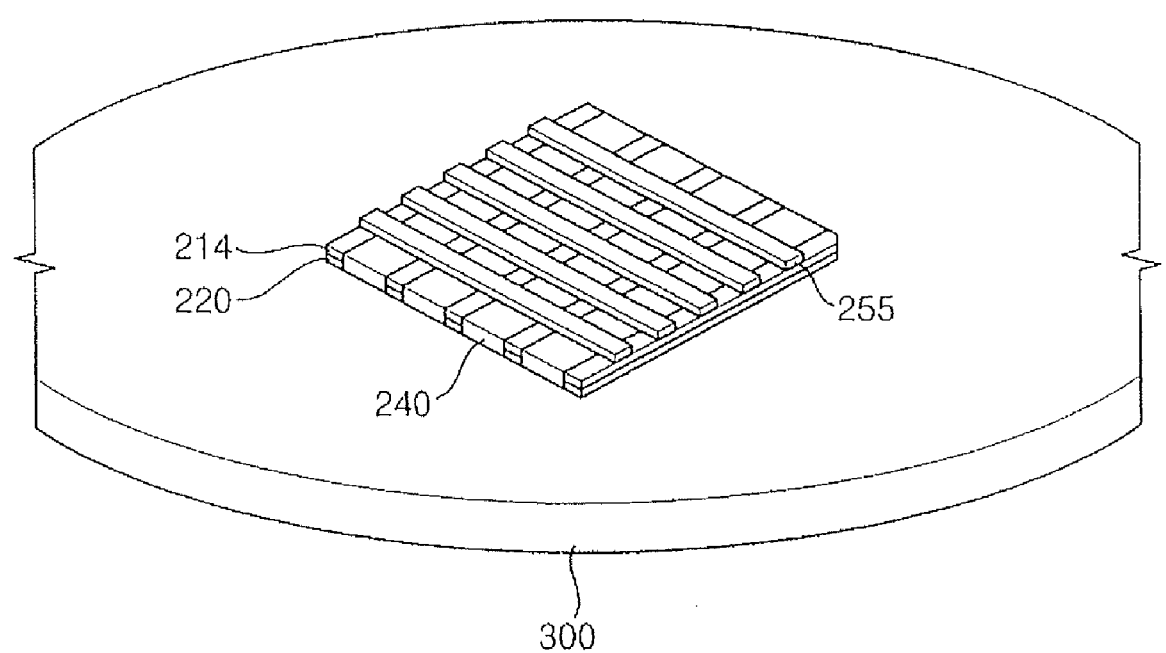

Referring now to FIG. 20, processes similar to or substantially the same as those illustrated with reference to FIGS. 8 to 12 are performed, and thus the memory unit including the third electrodes 220, the second nanowires 214 and fourth electrodes 255. Each of the third electrodes 220 and each of the second nanowires 214 extend in the first direction, and each of the fourth electrodes 255 extends in the second direction. Accordingly, the memory unit may be a cross-point array type memory unit.

Figure 21:
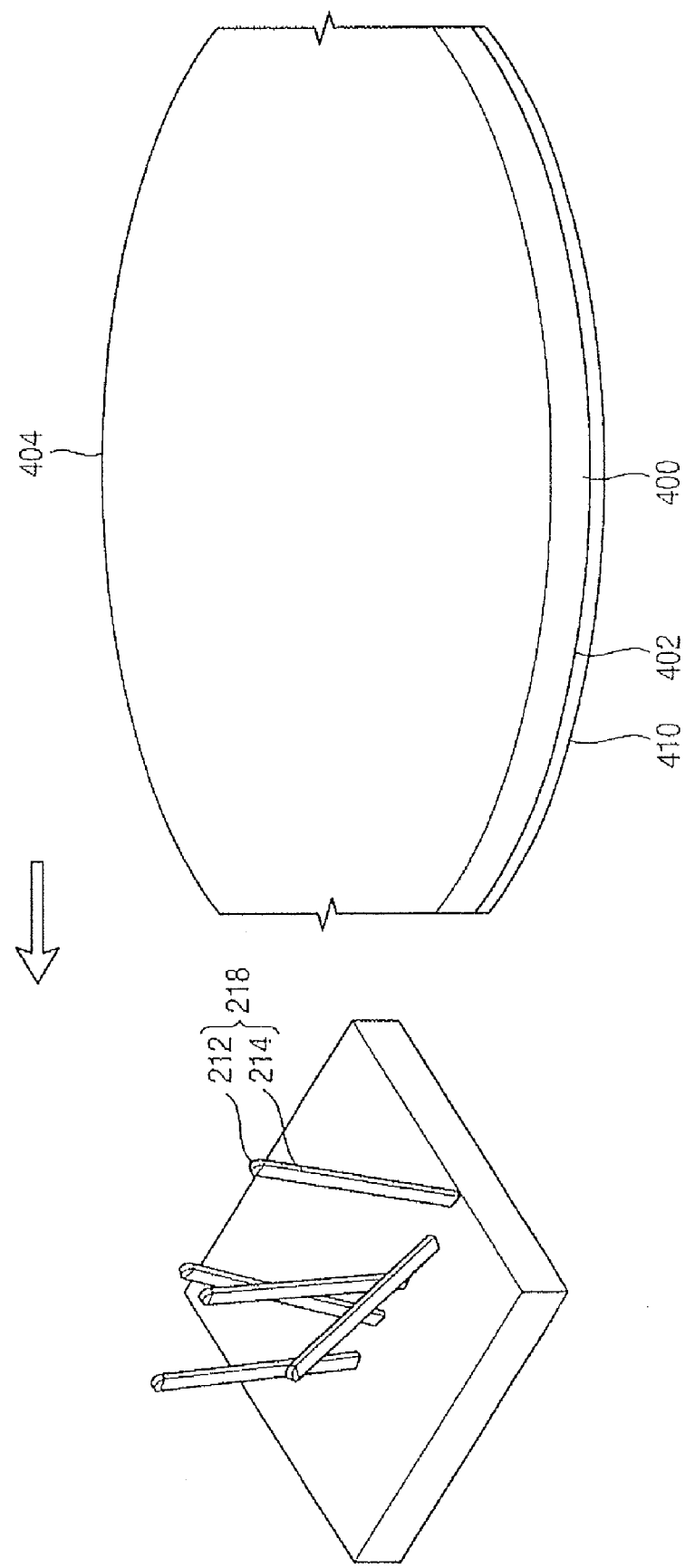

FIGS. 21 to 24 are perspective views illustrating processing steps in the fabrication of memory units in accordance with some embodiments. Referring first to FIG. 21, processes similar to or substantially the same as those illustrated with reference to FIGS. 13 to 16 are performed, so that a plurality of the second nanowire structures 218 is formed on the second substrate 200. Thus, like numerals refer to like elements, and repetitive explanations thereof are omitted here.

Figure 22:
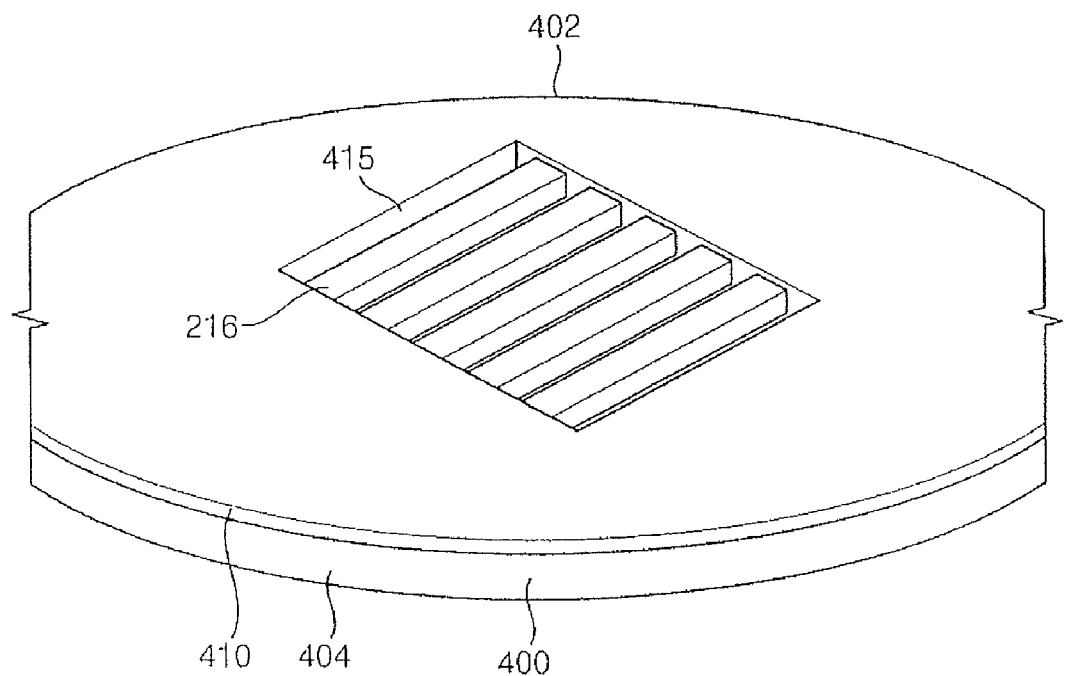

A fourth substrate 400 is moved above the second substrate 200. The fourth substrate 400 a first face 402 and a second face 404, and the fourth substrate 400 is moved above the second substrate 200, with the first face 402 facing the second substrate 200. A fourth insulation layer 410 is formed on the first face 402 having an opening 415 exposing the first face 402, and the second nanowire structures 218 may be arranged therein in a successive process. The fourth insulation layer 410 may be formed using an insulating material such as an oxide or a nitride. FIG. 22 illustrates the fourth substrate 400 overturned. Hereinafter, the method of manufacturing the memory unit is illustrated with reference to FIG. 21 together with FIG. 22.

In some embodiments, the fourth substrate 400 is moved along the first direction (or along a direction opposite to the first direction), and thus the second nanowire structures 218 formed on the second substrate 200 may be attached to the first face 402 of the fourth substrate 400. Each of the second nanowire structures 218 may be disposed on the first face 402 of the fourth substrate 400 exposed by the opening 415 in the first direction. An insulating material having a viscosity may be coated on the first face 402 so that the second nanowire structures 218 may be better attached to the first face 402 of the fourth substrate 400. Some of the second nanowire structures 218 may be attached onto the fourth insulation layer 410.

Thus, a second nanowire structure column including a plurality of second nanowire structures 218 each of which is arranged in the first direction on the first face 402 of the fourth substrate 400 exposed by the opening 415 may be formed. Additionally, a second nanowire structure array including a plurality of second nanowire structure columns at a distance from each other may be formed. The fourth substrate 400 is turned over so that the first face 402 may face upward.

Figure 23:
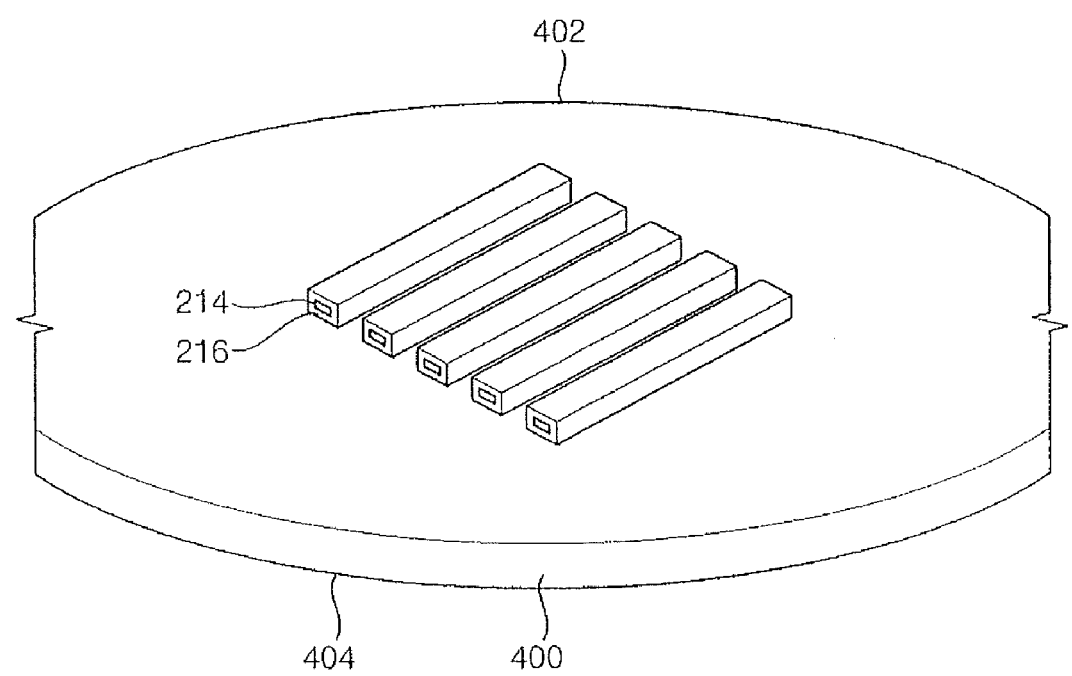

Referring to FIG. 23, the fourth insulation layer 410 is removed from the fourth substrate 400. Some of the second nanowire structures 218 on the fourth insulation layer 410 may be also removed from the fourth substrate 400. In some embodiments, the fourth insulation layer 410 may be removed by a wet etching process. Thus, a plurality of second nanowire structures 218, which includes the second nanowires 214 and the third electrode layer 216 and has the arrangement similar to that of FIG. 18, may be formed on the fourth substrate 400.

Figure 24:
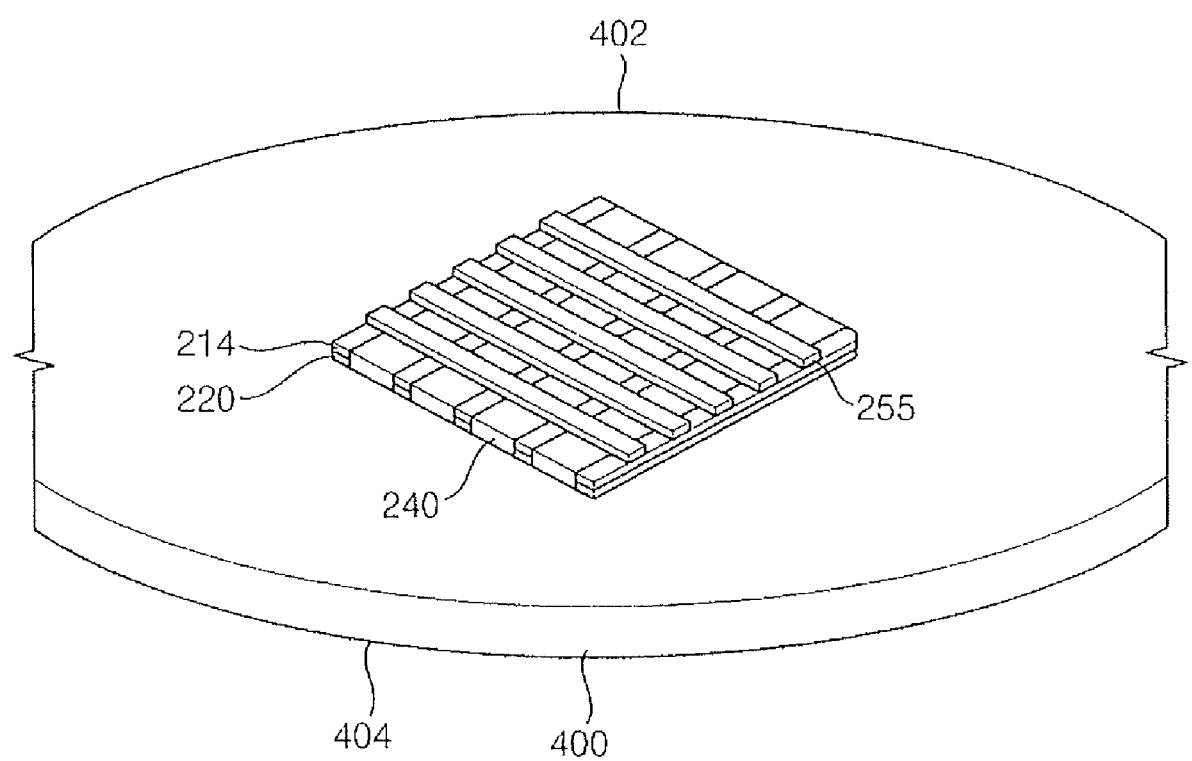

Referring now to FIG. 24, processes similar to or substantially the same as those illustrated with reference to FIGS. 19 to 20 are performed to complete the memory unit including the third electrodes 220, the second nanowires 214 and the fourth electrodes 255.

Figure 25:
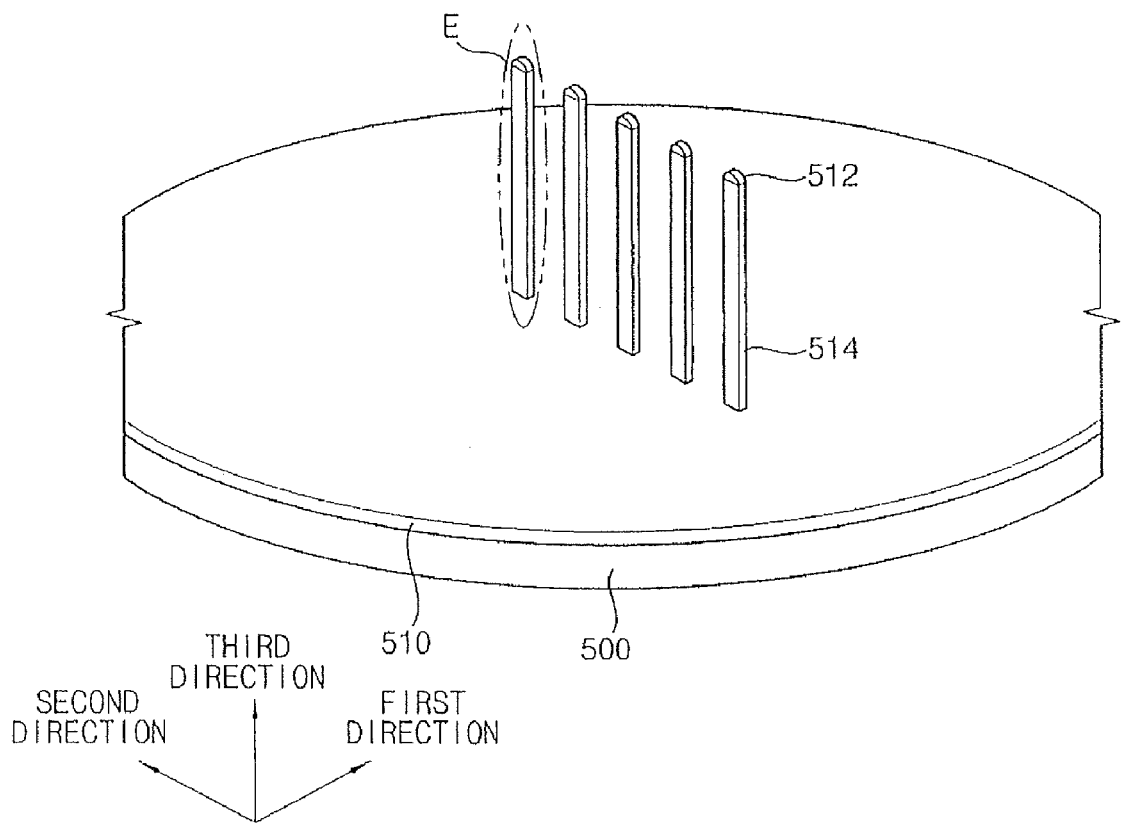

FIGS. 25 to 30 are perspective views illustrating processing steps in the fabrication of memory units in accordance with some embodiments. Referring first to FIG. 25, a fifth electrode layer 510 is formed on a fifth substrate 500. A process similar to or substantially the same as that illustrated with reference to FIG. 1 is performed, so that a plurality of the third catalyst particles 512 is formed on the fifth electrode layer 510 and a plurality of third nanowires 514 is grown on the fifth substrate 500 in a third direction perpendicular to the fifth substrate 500.

Figure 26:
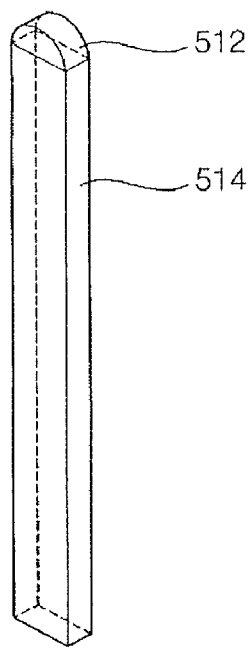

FIG. 26 is an enlarged perspective view of an area E in FIG. 25. As illustrated in FIG. 26, each of the third nanowires 514 may grow in the third direction to have a rectangular cross-sectional area. In further embodiments, each of the third nanowires 514 may grow in the third direction to have a polygonal cross-sectional area or a circular cross-sectional area.

Figure 27:
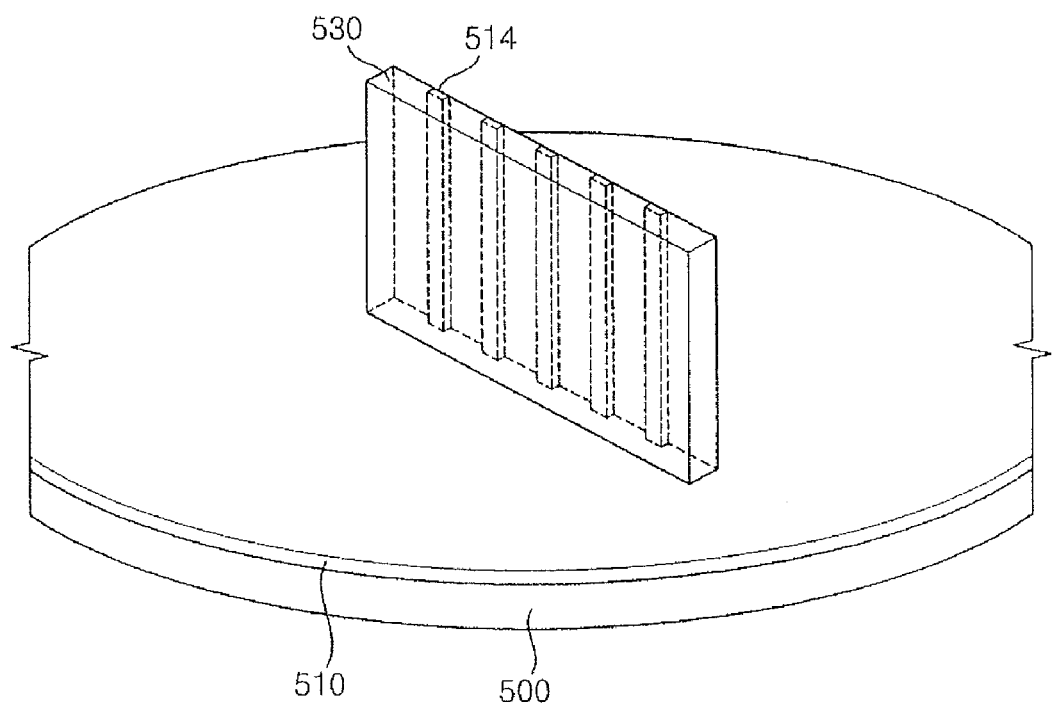

FIG. 27 is a perspective view illustrating a resultant structure of the third nanowires 514 and the third catalyst particles 512 in an area E after a successive process. As illustrated in FIG. 27, a fifth insulation layer 530 is formed on the fifth electrode layer 510 to cover the third nanowires 514 and the third catalyst particles 512. Thus, a third nanowire block including the third nanowires 514, the third catalyst particles 512 and the fifth insulation layer 514. The fifth insulation layer 530 may be partially removed so that one surface of each third nanowire structure 514 may be exposed and the third catalyst particles 512 may be removed.

Figure 28:
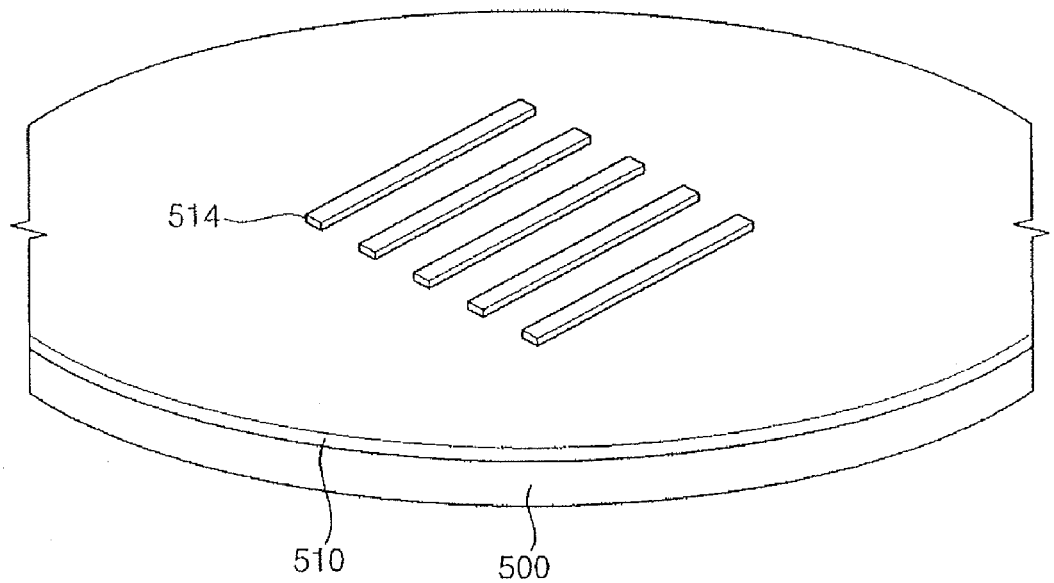

Referring now to FIG. 28, the third nanowire block is moved so that the third nanowires 514 are arrange in a first direction parallel to the fifth substrate 500. In some embodiments, each third nanowire block is rotated 90 degrees so that each of the third nanowires 514 may be arranged in the first direction. The exposed surfaces of the third nanowires 514 may contact the fifth substrate 500. The fifth insulation layer 530 is removed.

Figure 29:
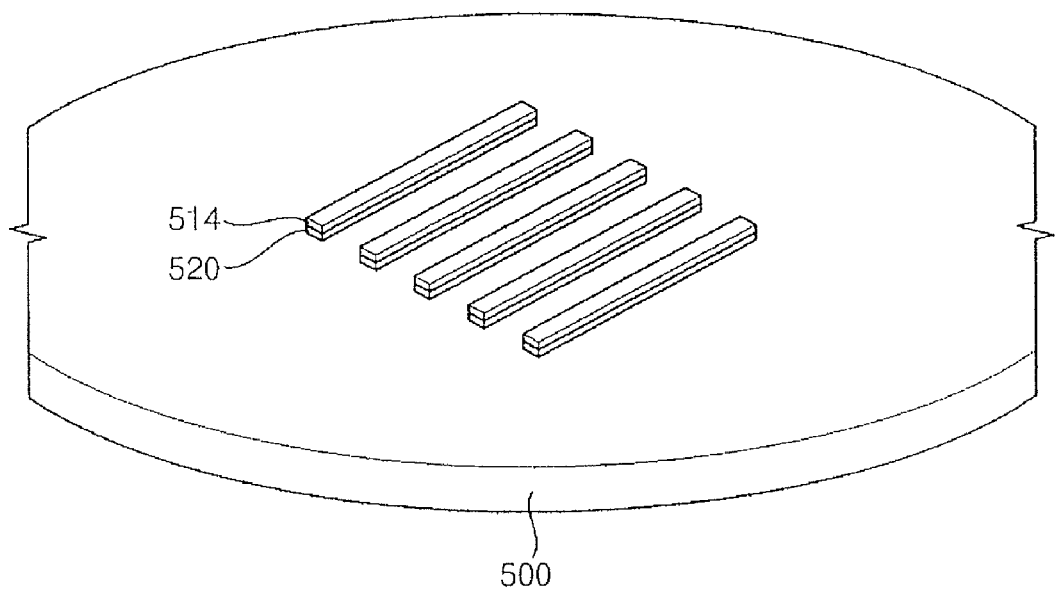

Referring to FIG. 29, the fifth electrode layer 510 is partially removed using the third nanowires 514 as an etching mask. Thus, a fifth electrode 520 extending in the first direction is formed beneath each third nanowire 514.

Figure 30:
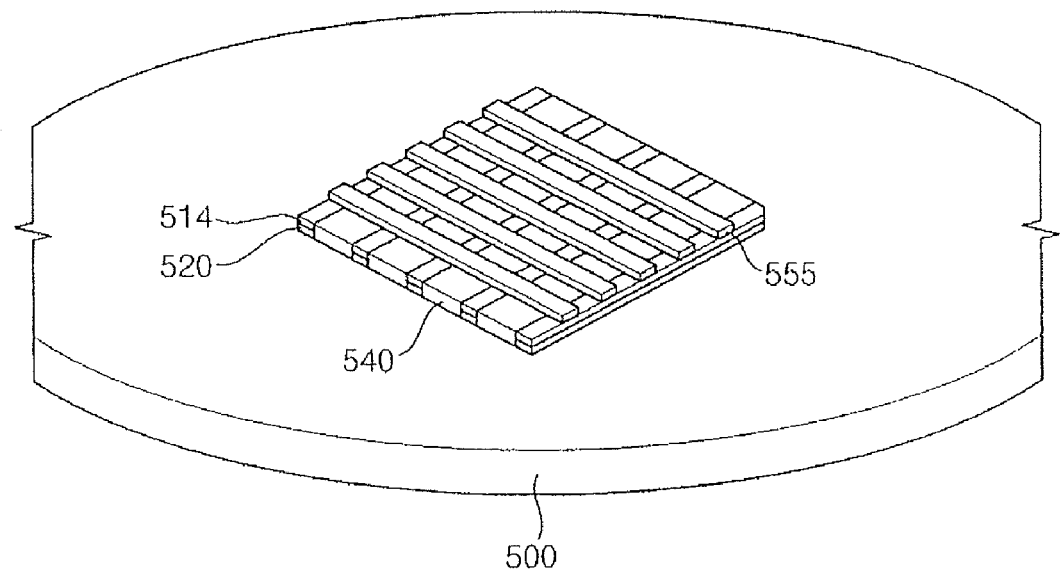

Referring now to FIG. 30, processes similar to or substantially the same as those illustrated with reference to FIGS. 8 to 12 are performed to complete the memory unit including the fifth electrodes 520, the third nanowires 514 and a plurality of sixth electrodes 555.

FIGS. 31 to 37 are perspective views illustrating processing steps in the fabrication of semiconductor devices in accordance with some embodiments. In order to avoid repetitive explanations, processes similar to or substantially the same as those used in manufacturing the memory unit in accordance with some embodiments are not explained herein in detail, however, those skilled in the art can easily understand that the omitted processes are also within the scope of the present invention.

Figure 31:
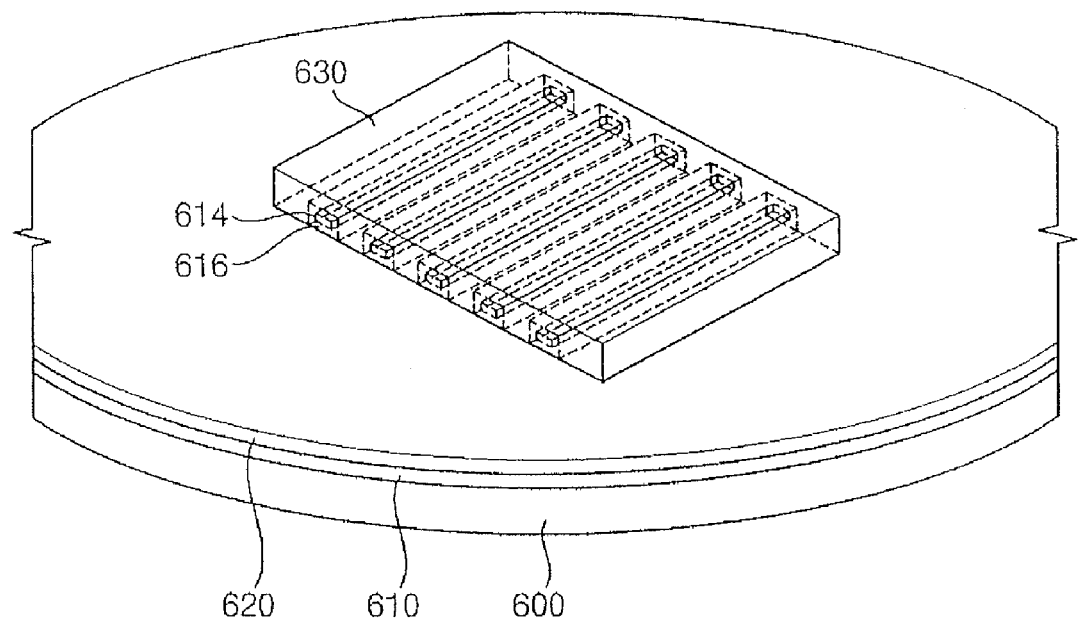

Referring first to FIG. 31, a first conductive layer 610 and a diode layer 620 are formed on a sixth substrate 600. The first conductive layer 610 may be formed using a metal or a metal compound. The diode layer 620 may be formed by implanting first impurities and second impurities into a semiconductor layer including a semiconductor material such as silicon or germanium, thereby forming a first semiconductor layer (not shown) and a second semiconductor layer (not shown), respectively.

A fourth nanowire block including fourth nanowires 614, seventh electrode layers 616 and a sixth insulation layer 630 is disposed on the diode layer 620. In some embodiments, the fourth nanowire block may be disposed so that each of the fourth nanowires 614 may extend in a first direction parallel to the sixth substrate 600.

Figure 32:
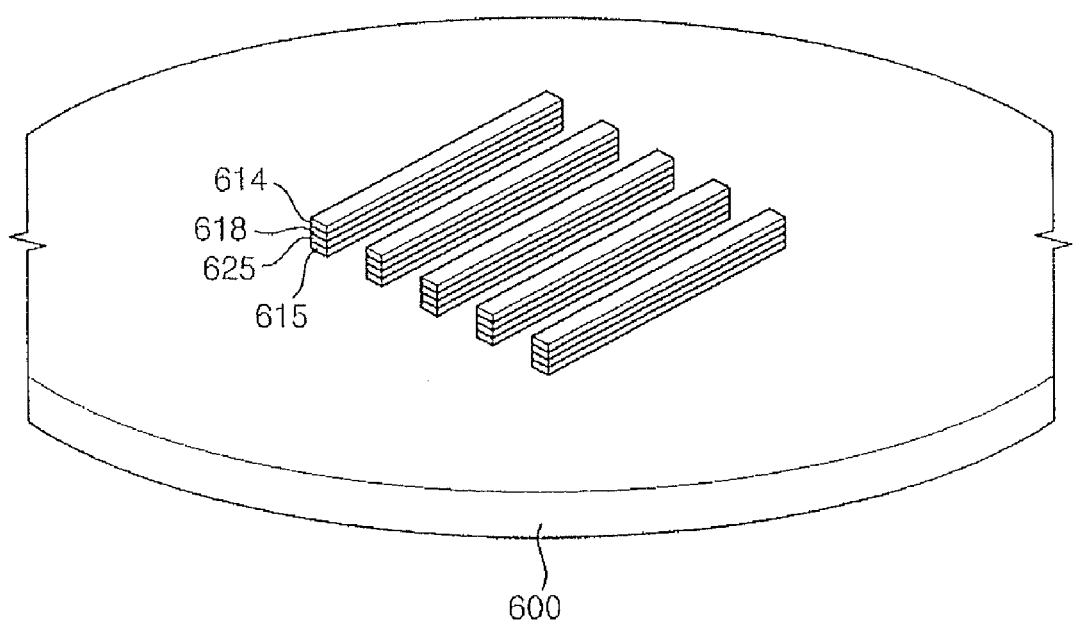

Referring now to FIG. 32, the sixth insulation layer 630 may be removed by a dry etching process or a wet etching process. Portions of each seventh electrode layer 616 on an upper portion and a lateral portion of each fourth nanowire 614 may be removed by a dry etching process, and thus a plurality of seventh electrodes 618 may be formed beneath the fourth nanowires 614.

A dry etching process using the fourth nanowires 614 and the seventh electrodes 618 as etching masks is performed to partially remove the diode layer 620 and the first conductive layer 610, so that first conductive lines 615, first diodes 625, the seventh electrodes 618 and the fourth nanowires 614, each of which extends in the first direction, may be sequentially stacked on the sixth substrate 600.

Figure 33:
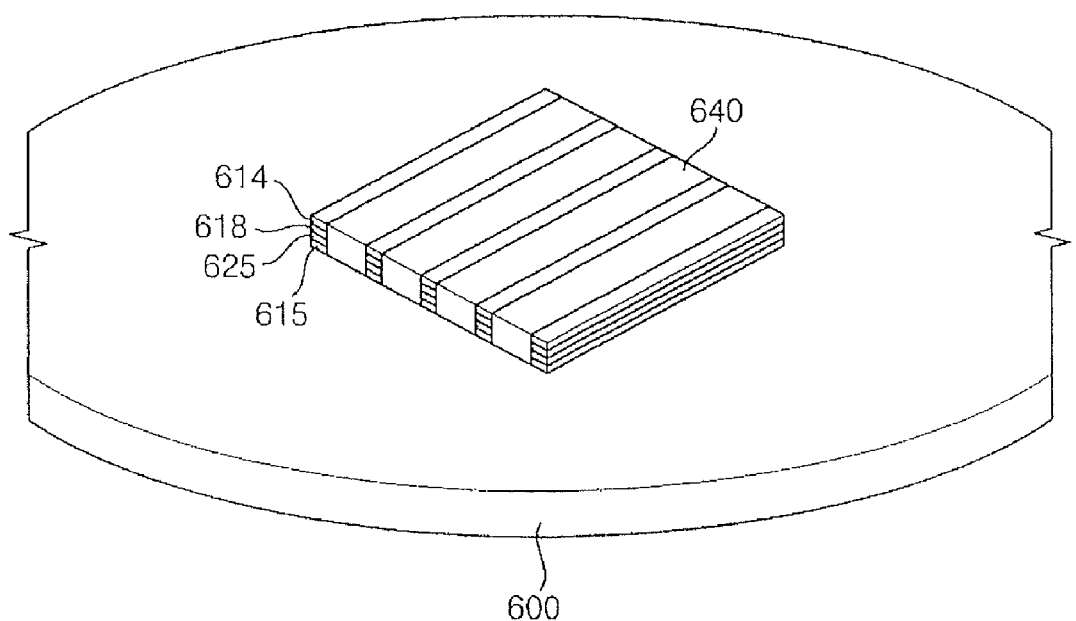

Referring now to FIG. 33, a seventh insulation layer 640 may be formed on the sixth substrate 600 to fill up spaces between structures each of which includes the first conductive line 615, the first diode 625, the seventh electrode 618 and the fourth nanowire 614.

Figure 34:
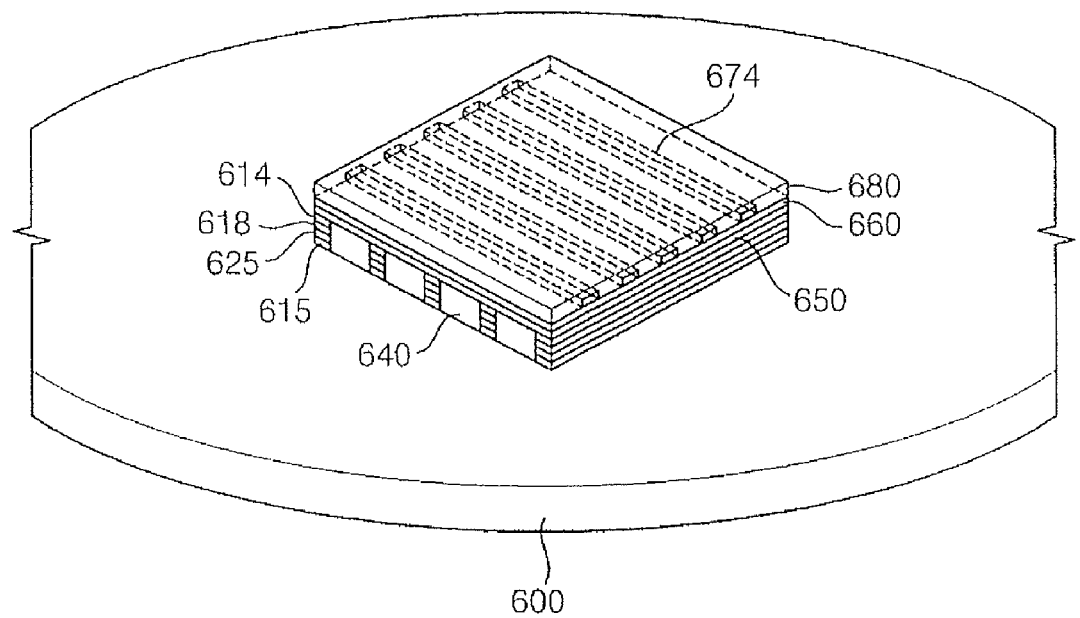

Referring now to FIG. 34, an eight electrode layer 650, a second conductive layer 660 and a fifth nanowire block are disposed on the fourth nanowires 614 and the seventh insulation layer 640.

The eight electrode layer 650 and the second conductive layer 660 may be formed using a metal or a metal compound. The fifth nanowire block may include a fifth nanowires 674 and an eight insulation layer 680. In some embodiments, the fifth nanowire block may be disposed so that each of the fifth nanowires 674 extends in a second direction perpendicular to the first direction.

Figure 35:
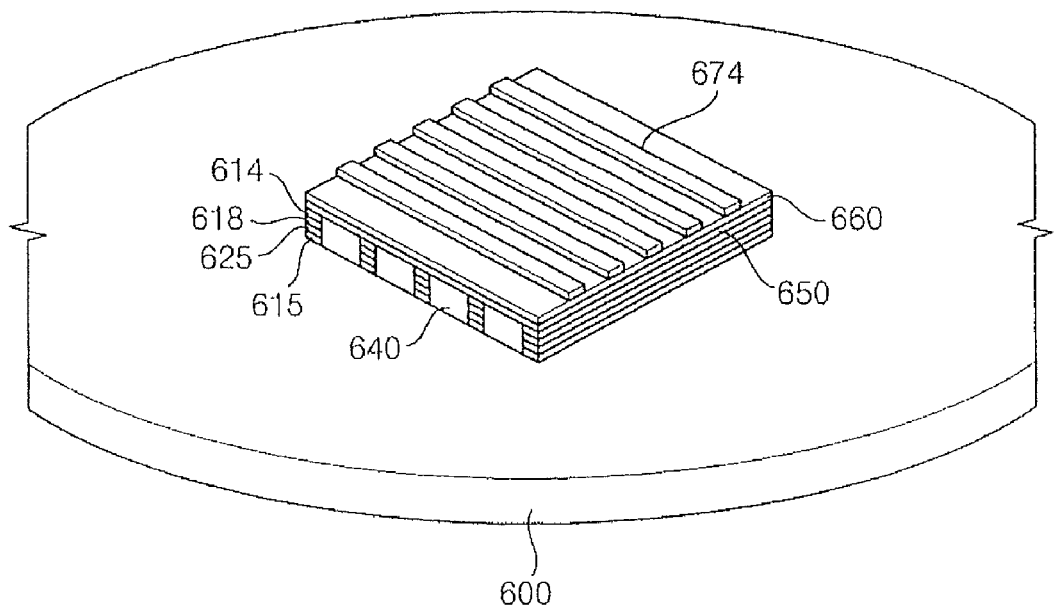

Referring now to FIG. 35, the eight insulation layer is removed. The eight insulation layer 680 may be removed by a dry etching process or a wet etching process.

Figure 36:
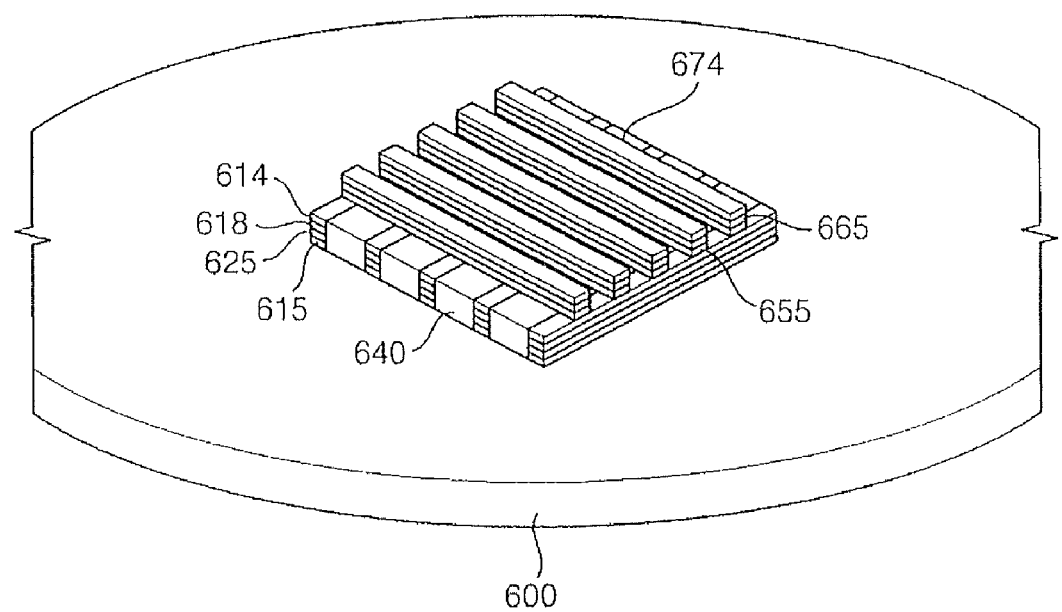

Referring now to FIG. 36, a dry etching process using the fifth nanowires 674 as an etching mask is performed to partially remove the second conductive layer 660 and the eight electrode layer 650. Thus, a plurality of eight electrodes 655 and a plurality of second conductive lines 665, each of which extends in the second direction, may be formed on the fourth nanowires 614 and the seventh insulation layer 640.

Figure 37:
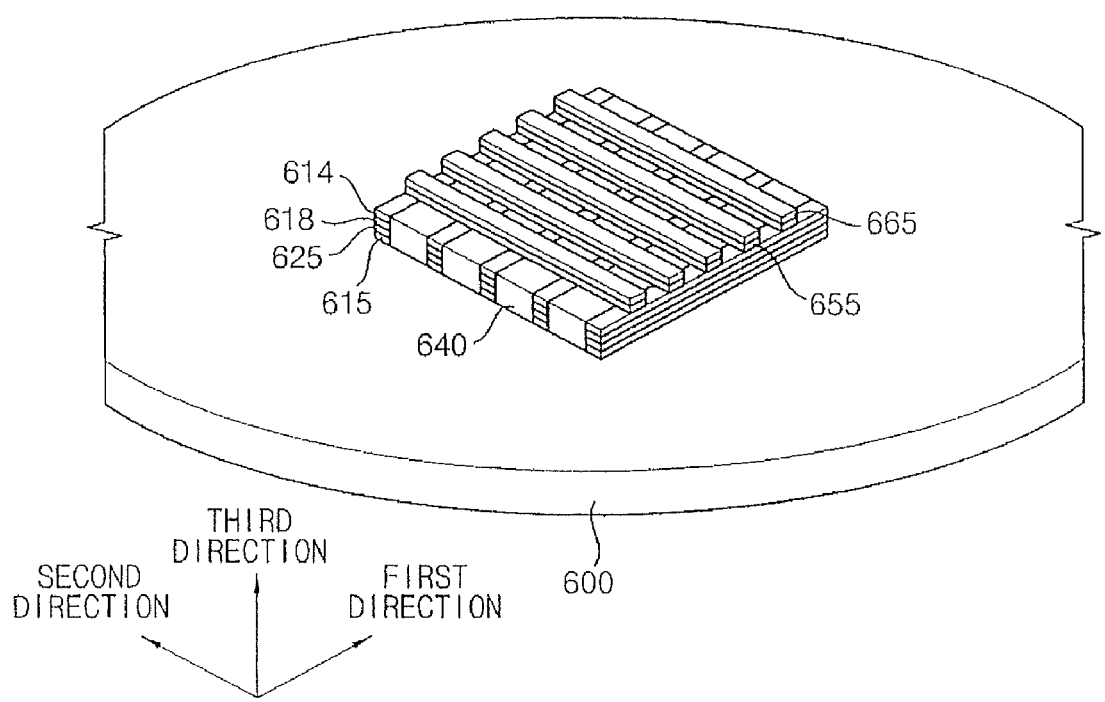

Referring now to FIG. 37, the fifth nanowires 674 are removed to complete the semiconductor device. In some embodiments, each of the first conductive lines 615 may serve as a word line, and each of the second conductive lines 665 may serve as a bit line. In further embodiments, in the process illustrated with reference to FIG. 34, only the second conductive layer 660 and the fifth nanowire block are formed on the fourth nanowires 614 and the seventh insulation layer 640, and the eight electrode layer 650 may not be formed. In this case, each of the second conductive lines 665 may serve as both of an upper electrode and the bit line.

The semiconductor device in accordance with some embodiments may have following structural characteristics. Particularly, each of the first conductive lines 615, each of the first diodes 625, each of the seventh electrodes 618 and each of the fourth nanowires 614 extend in the first direction parallel to the sixth substrate 600, and each of the eight electrodes 655 and each of the second conductive lines 665 extend in the second direction perpendicular to the first direction. Thus, the first conductive lines 615, the first diodes 625, the seventh electrodes 618 and the fourth nanowires 614 may be linearly disposed on the sixth substrate 600, and the eight electrodes 655 may be linearly disposed to make contact with top portions of the fourth nanowires 614. Accordingly, the semiconductor device may be a cross-point array type semiconductor device.

Figure 38:
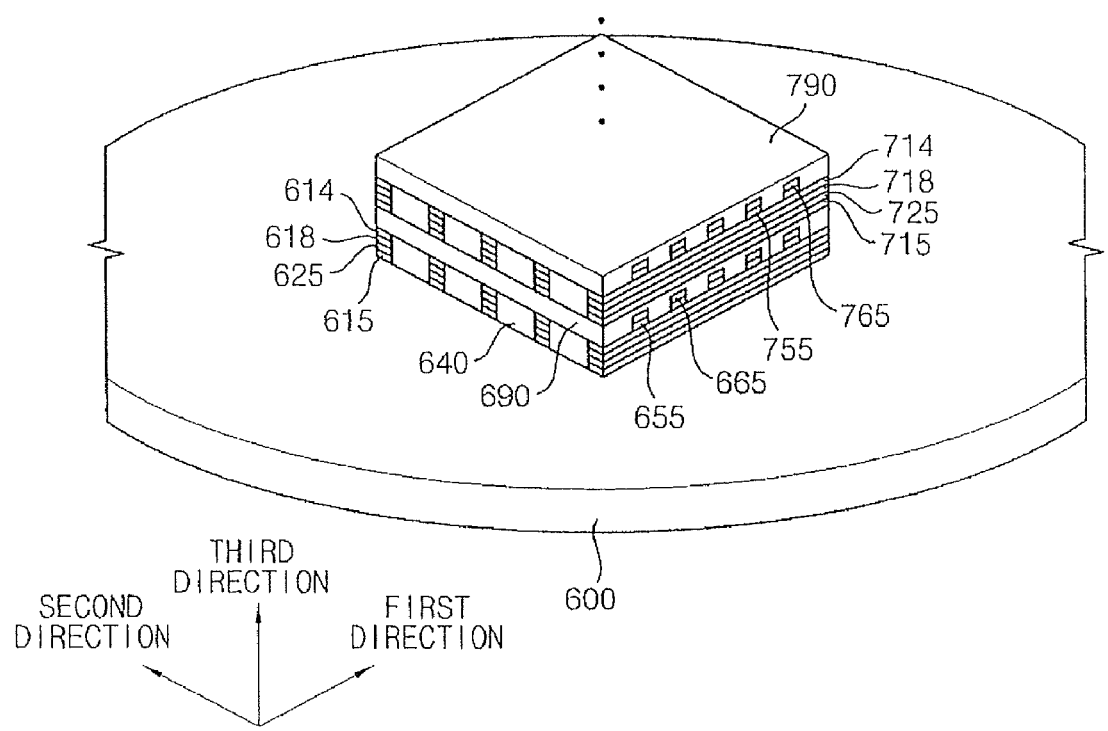

FIG. 38 is a perspective view illustrating processing steps in the fabrication of semiconductor devices in accordance with some embodiments. Referring to FIG. 38, a plurality of the semiconductor devices in FIG. 37 may be vertically stacked on the sixth substrate 600, thereby forming the stacked semiconductor device. In particular, a first semiconductor device and a second semiconductor device, each of which is substantially the same as that of FIG. 37, are stacked in a third direction perpendicular to the sixth substrate 600, thereby completing the stacked semiconductor device.

The first semiconductor device includes the first conductive lines 615, the first diodes 625, the seventh electrodes 618 and the fourth nanowires 614, each of which extends in the first direction, and the eighth electrodes 655 and the second conductive lines 665, each of which extends in the second direction perpendicular to the first direction. The second semiconductor device includes the third conductive lines 715, the second diodes 725, the ninth electrodes 718 and the sixth nanowires 714, each of which extends in the first direction, and the tenth electrodes 755 and the fourth conductive lines 765, each of which extends in the second direction perpendicular to the first direction. A ninth insulation layer 690 is formed on the fourth nanowires 614, the seventh insulation layer 640 and the second conductive lines 665 to fill up spaces between structures each of which includes the second conductive line 665 and the eighth electrode 655. The ninth insulation layer 690 may insulate the first and second semiconductor devices from each other.

The stacked semiconductor device in accordance with some embodiments may have two or more than two semiconductor devices sequentially vertically stacked, and an insulation layer such as the ninth insulation layer 690 or a tenth insulation layer 790 may be formed to insulate the semiconductor devices from each other.

FIGS. 39 to 51 are cross-sectional views illustrating processing steps in the fabrication of semiconductor devices in accordance with some embodiments. In order to avoid repetitive explanations, processes similar to or substantially the same as those used in manufacturing the memory unit in accordance with some embodiments are not explained herein in detail, however, those skilled in the art can easily understand that the omitted processes are also within the scope of the present invention. FIGS. 39 to 46 are cross-sectional views illustrating the semiconductor device cut in a second direction, and FIGS. 47 to 51 are cross-sectional views illustrating the semiconductor device cut in a first direction perpendicular to the second direction, particularly, cut along a line penetrating a second contact 852 and a pad 854 in the first direction.

Figure 39:
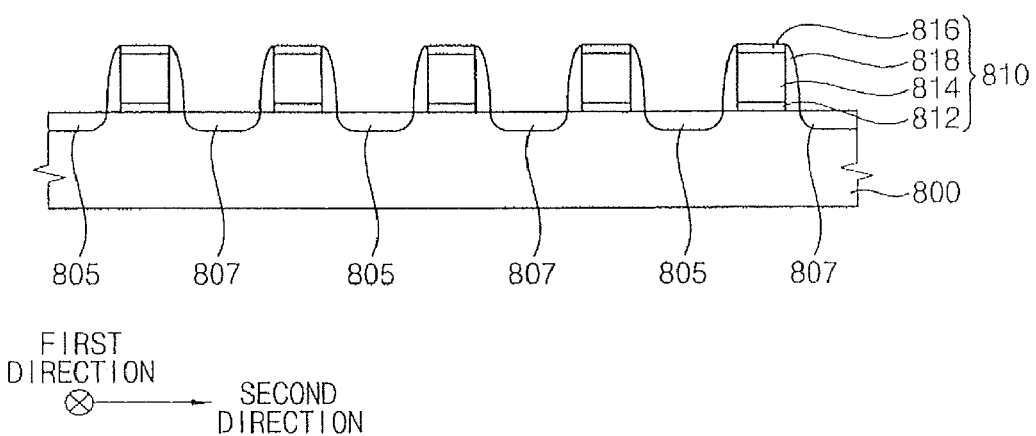

Referring first to FIG. 39, an isolation process is performed to form an isolation layer (not shown) on a seventh substrate 800, thereby defining an active region and a field region at the seventh substrate 800. The seventh substrate 800 may include a semiconductor material, and the isolation layer may be formed by a shallow trench isolation (STI) process or a thermal oxidation process.

A gate insulation layer, a gate conductive layer and a gate mask layer are sequentially formed on the seventh substrate 800, and the gate insulation layer, the gate conductive layer and the gate mask layer are patterned to form a plurality of gate structures 810 on the active region of the seventh substrate 800. Each of the gate structures 810 includes a gate insulation layer pattern 812, a gate electrode 814 and a gate mask 816. In some embodiments, the gate structures 810 are disposed in the second direction, and each of the gate structures 810 extends in the first direction perpendicular to the second direction. After forming a nitride layer covering the gate structures 810 on the seventh substrate 800, the nitride layer is anisotropically etched to form gate spacers 818 on sidewalls of the gate structures 810.

An ion implantation process using the gate structures 810 as an ion implantation mask is performed to form first impurity regions 805 and second impurity regions 807 at portions of the active region adjacent to the gate structures 810. Thus, a plurality of transistors each of which includes the gate structure 810 and the first and second impurity regions 805 and 807 may be formed at the active region of the seventh substrate 800. In some embodiments, each transistor may serve as a switching element for driving a memory unit that will be formed in a successive process.

Figure 40:
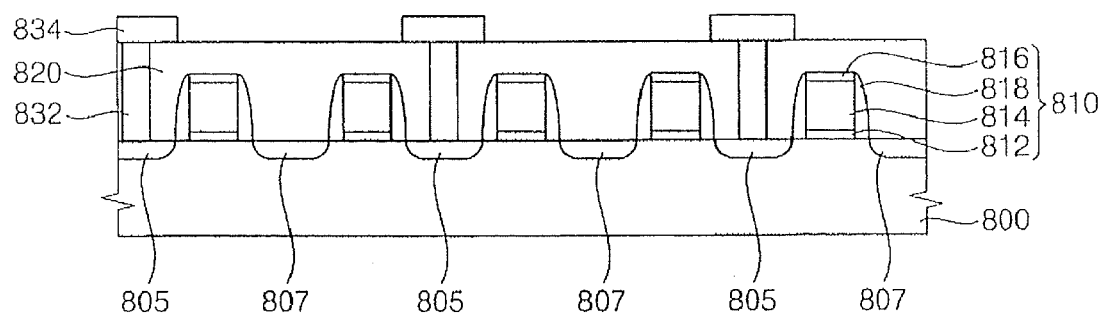

Referring now to FIG. 40, a first insulating interlayer 820 is formed on the seventh substrate 800 to cover the transistors.

The first insulating interlayer 820 may be formed using an oxide, a nitride and/or an oxynitride. The first insulating interlayer 820 may be formed by a CVD process, a low pressure chemical vapor deposition (LPCVD) process, a plasma enhanced chemical vapor deposition (PECVD) process, an ALD process or a high-density plasma chemical vapor deposition (HDP-CVD) process.

The first insulating interlayer 820 is partially removed to form a plurality of contact holes (not shown) exposing the first impurity regions 805, respectively. A third conductive layer is formed on the seventh substrate 800 and the first insulating interlayer 820 to fill up the first contact holes. The third conductive layer may be formed using a metal and/or a metal nitride. An upper portion of the third conductive layer is removed until the first insulating interlayer 820 is exposed, so that a plurality of first contacts 832 filling up the first contact holes is formed. The first contacts 832 may be formed by a chemical mechanical polishing (CMP) process and/or an etch back process.

A fourth conductive layer is formed on the first contacts 832 and the first insulating interlayer 820 using doped polysilicon, a metal or a metal nitride. The fourth conductive layer is patterned to form fifth conductive lines 834 contacting the first contacts 834. Each of the fifth conductive lines 834 may linearly extend in the first direction. In some embodiments, the fifth conductive lines 834 include bit lines.

Figure 41:
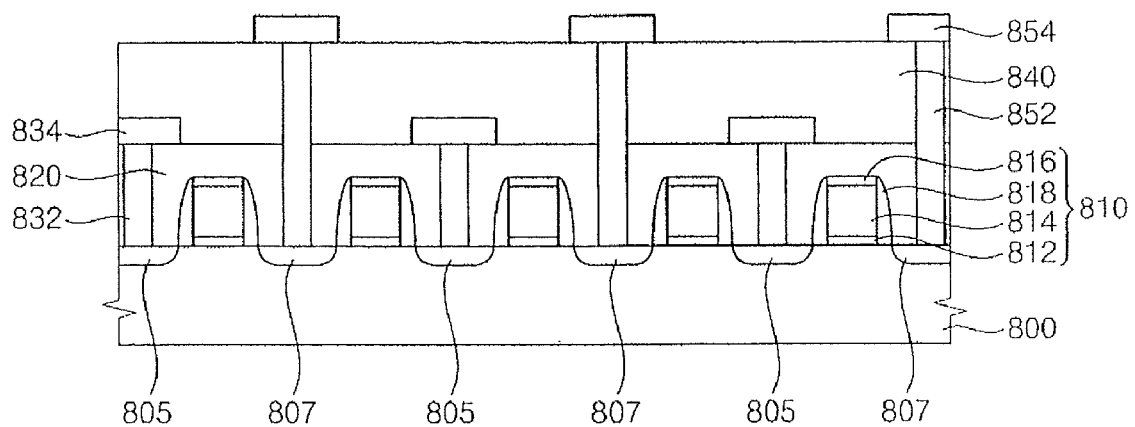

Referring now to FIG. 41, a second insulating interlayer 840 is formed on the first insulating interlayer 820 to cover the fifth conductive lines 834. The second insulating interlayer 840 may be formed using an oxide, a nitride and/or an oxynitride. The first and second insulating interlayers 820 and 840 are partially removed to form a plurality of second contact holes (not shown) exposing the second impurity regions 807. A fifth conductive layer is formed on the seventh substrate 800 and the second insulating interlayer 840 to fill up the second contact holes. The fifth conductive layer may be formed using a metal and/or a metal nitride. An upper portion of the fifth conductive layer is removed by a CMP process and/or an etch back process until the second insulating interlayer 840 is exposed, so that a plurality of second contacts 852 filling up the second contact holes is formed. A sixth conductive layer is formed on the second contacts 852 and the second insulating interlayer 840 using doped polysilicon, a metal or a metal nitride. The sixth conductive layer is patterned to form a plurality of pads 854 contacting the second contacts 852. Each of the pads 854 may linearly extend in the first direction.

Figure 42:
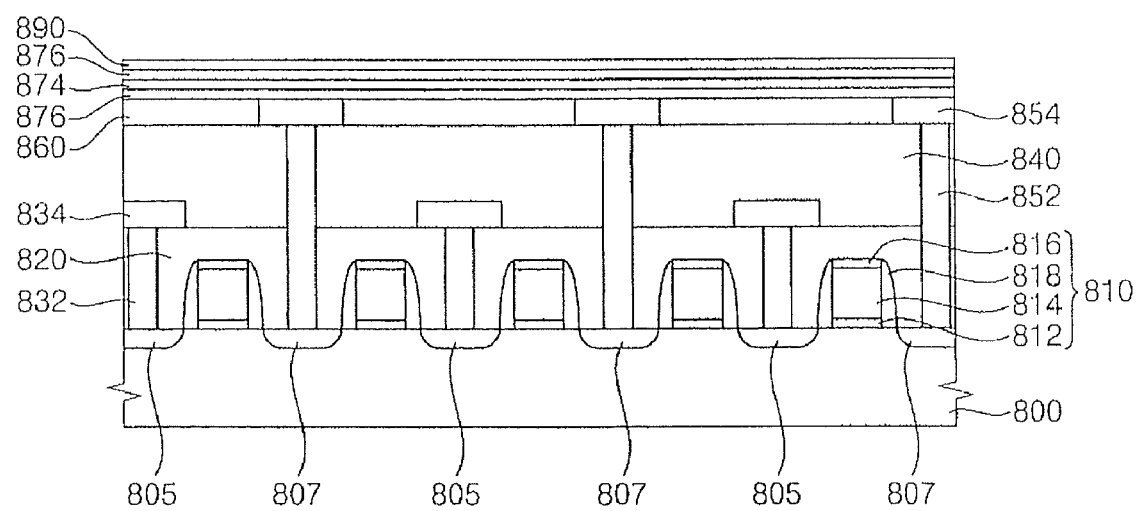
Figure 47:
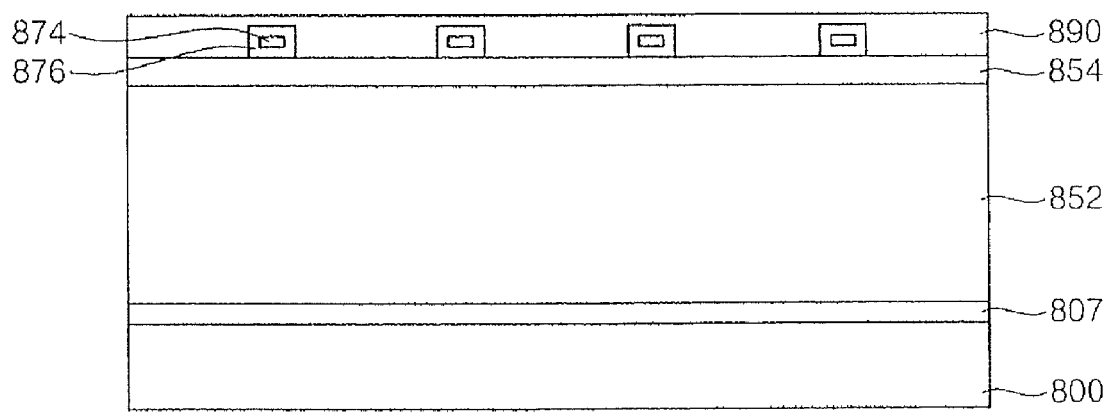

Referring now to FIGS. 42 and 47, a third insulating interlayer 860 is formed on the second insulating interlayer 840 to cover the pads 854. An upper portion of the third insulating interlayer 860 is removed by a CMP process and/or an etch back process until the pads 854 are exposed.

A sixth nanowire block including seventh nanowires 874, eleventh electrode layers 876 and an eleventh insulation layer 890 is disposed on the pads 854 and the third insulating interlayer 860. In some embodiments, the sixth nanowire block may be disposed so that each seventh nanowire 614 extends in the second direction.

Figure 43:
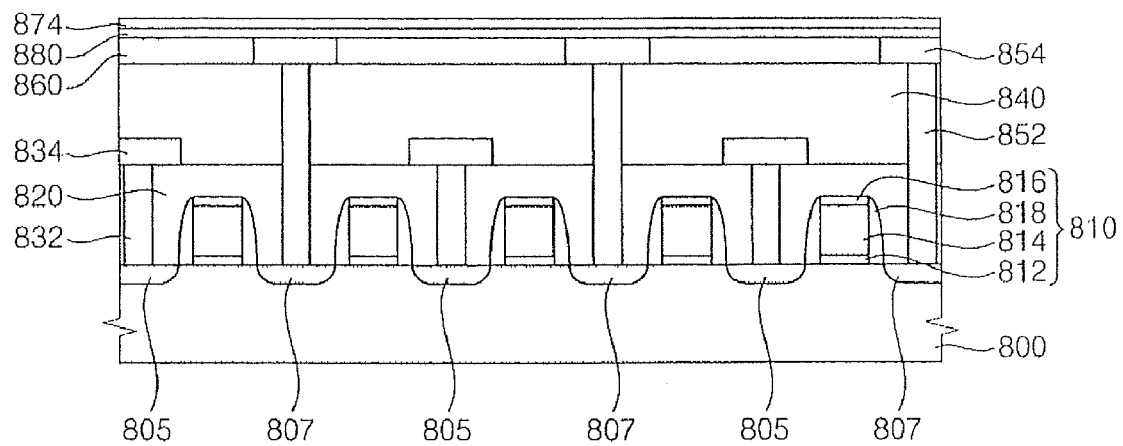
Figure 48:
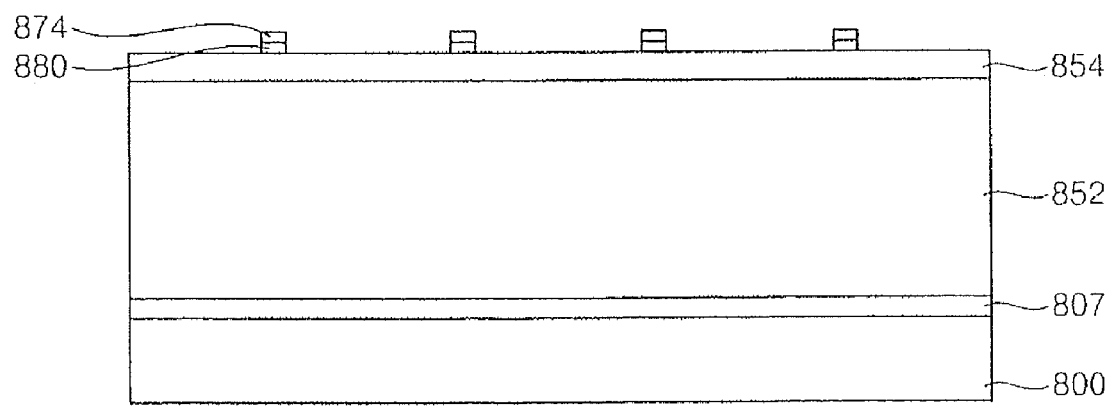

Referring now to FIGS. 43 and 48, the eleventh insulation layer 890 is removed by a dry etching process or a wet etching process.

Portions of each eleventh electrode layer 876 on an upper portion and a lateral portion of each seventh nanowire 874 are removed by a dry etching process to form a plurality of eleventh electrodes 880 beneath the seventh nanowires 874.

Figure 44:
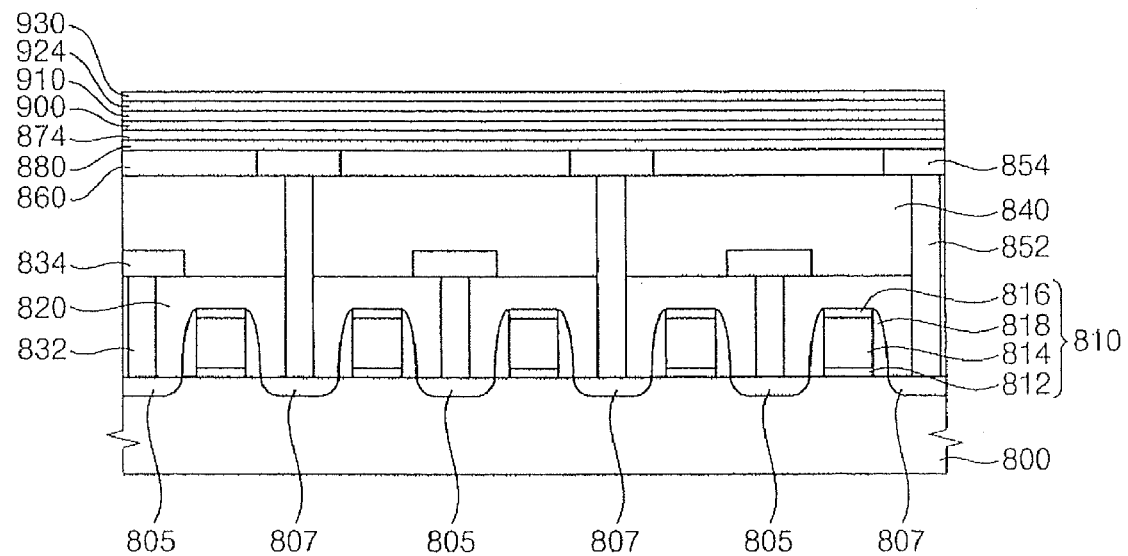
Figure 49:
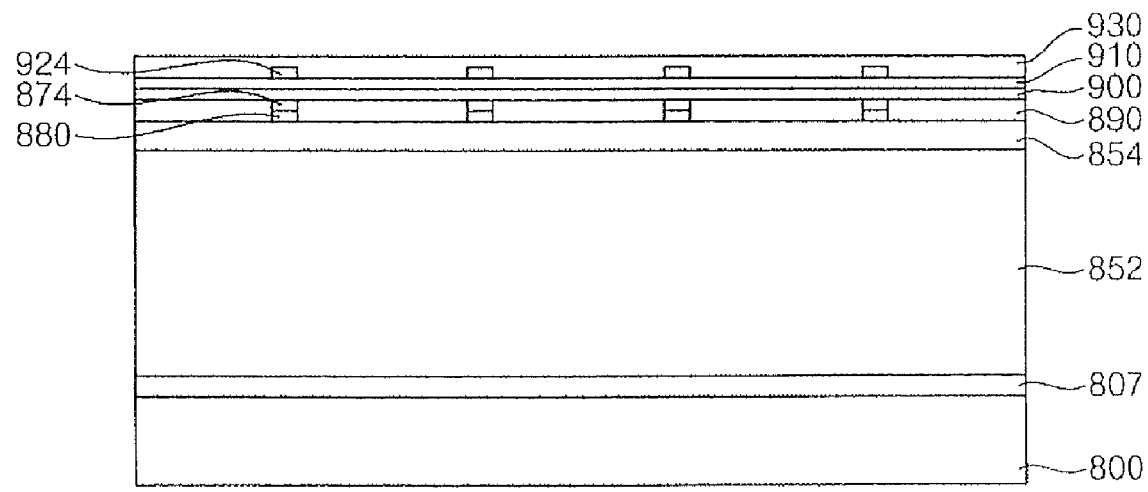

Referring now to FIGS. 44 and 49, a fourth insulating interlayer 890 is formed on the third insulating interlayer 860 to cover the seventh nanowires 874 and the eleventh electrodes 880. An upper portion of the fourth insulating interlayer 890 is removed by a CMP process and/or an etch back process until the seventh nanowires 874 are exposed.

A twelfth electrode layer 900 and a seventh conductive layer 910 are formed on the seventh nanowires 874 and the fourth insulating interlayer 890. The twelfth electrode layer 900 and the seventh conductive layer 910 may be formed using a metal or a metal compound.

A seventh nanowire block including a plurality of eighth nanowires 924 and a twelfth insulation layer 930 is disposed on the seventh conductive layer 910. In some embodiments, the seventh nanowire block is disposed so that each eighth nanowire 924 extends in the second direction and overlaps each seventh nanowire 874.

Figure 45:
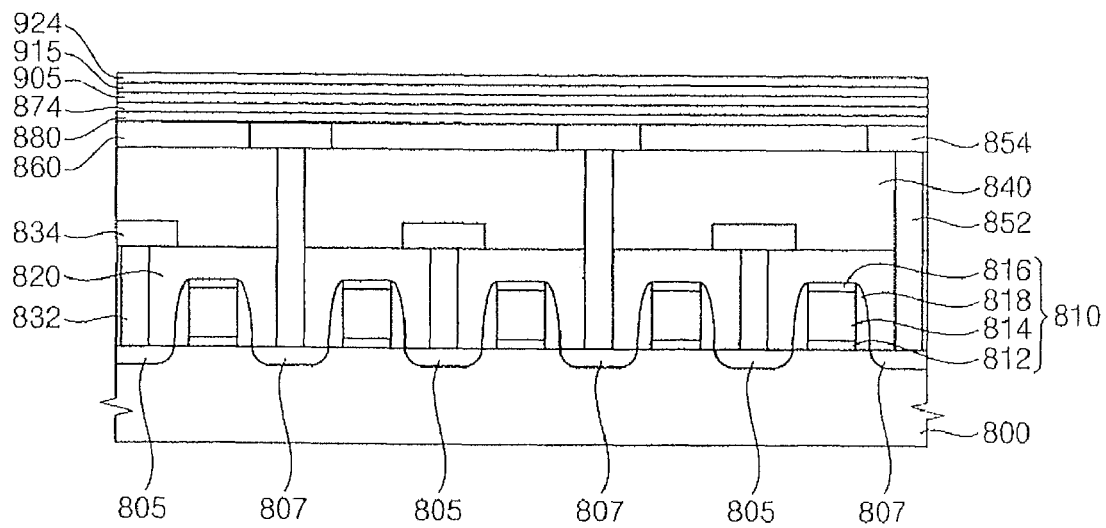
Figure 50:
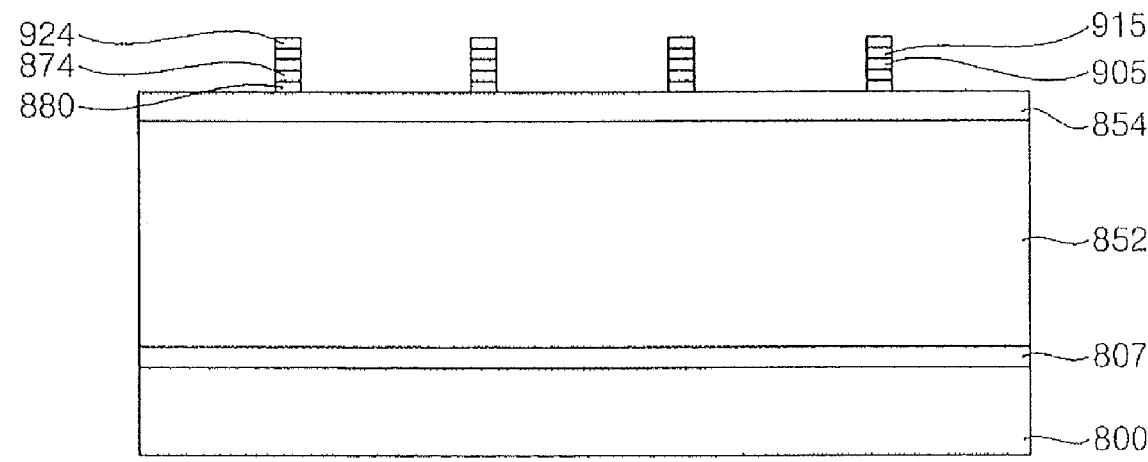

Referring now to FIGS. 45 and 50, the twelfth insulation layer 930 is removed by a dry etching process or a wet etching process. The seventh conductive line 910 and the twelfth electrode layer 900 are partially removed by a dry etching process using the eighth nanowires 924 as an etching mask to form a plurality of sixth conductive lines 915 and a plurality of twelfth electrodes 905 under the eighth nanowires 924. Thus, the eleventh electrodes 880, the seventh nanowires 874, the twelfth electrodes 905 and the sixth conductive lines 915 may be sequentially formed on the pads 854 and the third insulating interlayer 860 in a direction perpendicular to the seventh substrate 800. In some embodiments, the sixth conductive lines include word lines.

Figure 46:
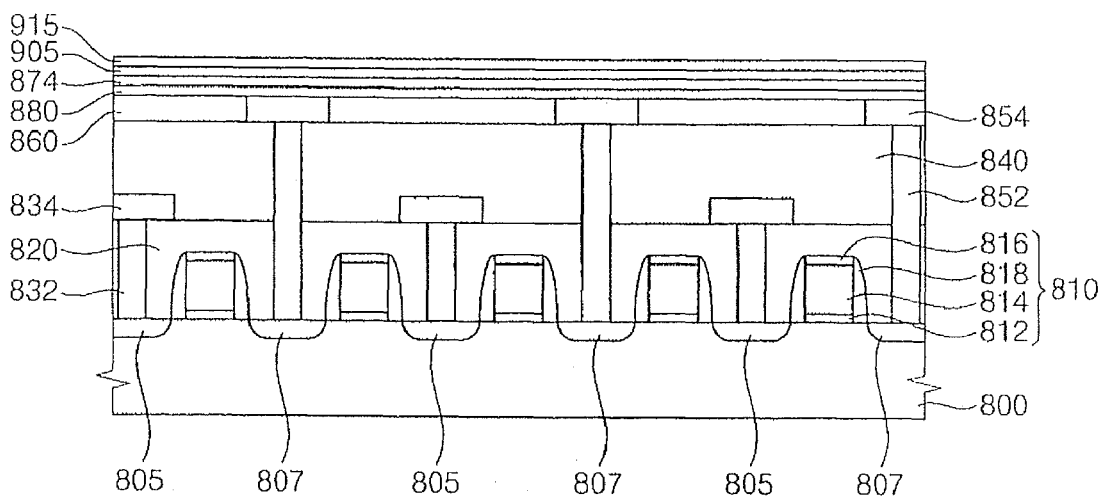
Figure 51:
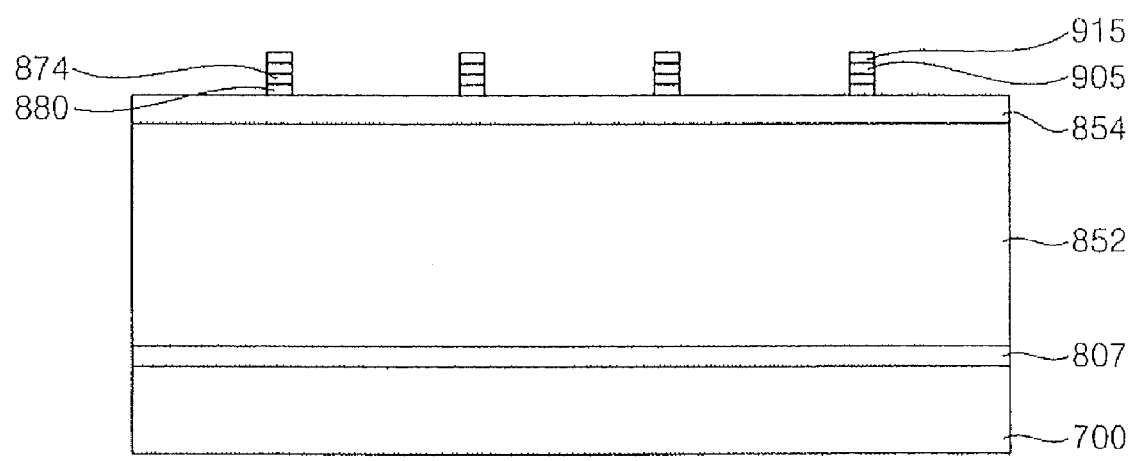

Referring now to FIGS. 46 and 51, the eighth nanowires 924 are removed to complete the semiconductor device. According to some embodiments, after nanowires are grown by a bottom-up method, the nanowires are moved so that the nanowires may be disposed parallel to the substrate. Electrode patterns may be formed using the nanowires as an etching mask, thereby manufacturing a cross-point array type memory unit. A diode layer and a conductive layer may be partially etched using the nanowires as an etching mask, so that a lower electrode and a word line may be formed. Similarly, an upper electrode and a bit line may be formed using the nanowires as an etching mask, so that a cross-point array type semiconductor device may be easily manufactured. A stacked semiconductor device including a plurality of semiconductor devices may be easily manufactured by stacking the above semiconductor devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:
a plurality of first conductive lines on a substrate, each of the first conductive lines extending in a first direction parallel to the substrate;
a plurality of first diodes extending on the plurality of first conductive lines, respectively;
a plurality of first electrodes extending on the plurality of first diodes, respectively;
a plurality of first nanowires extending on the plurality of first electrodes, respectively; and
a plurality of second conductive lines on upper surfaces of the plurality of first nanowires, the plurality of second conductive lines extending in a second direction that is substantially perpendicular to the first direction.

2. The semiconductor device of claim 1, further comprising an insulation layer between the plurality of first conductive lines, diodes, electrodes and nanowires, such that the insulation layer fills up spaces between the plurality of first conductive lines, diodes, electrodes and nanowires.

3. The memory unit of claim 1, wherein the plurality of first conductive lines serve as word lines and the plurality of second conductive lines serve as bit lines.

4. The semiconductor device of claim 1, further comprising a plurality of second electrodes between the plurality of second conductive lines and the upper surface of plurality of first nanowires.

5. The semiconductor device of claim 4, wherein the plurality of first conductive lines serve as word lines and the plurality of second conductive lines serve as bit lines.

6. The semiconductor device of claim 4, further comprising an insulation layer between the plurality of second electrodes and second conductive lines, such that the insulation layer fills up spaces between the plurality of second electrodes and second conductive lines.

* * * * *